(12) United States Patent
Bradfield

(10) Patent No.: US 10,090,735 B2
(45) Date of Patent: Oct. 2, 2018

(54) RADIALLY ADAPTABLE PHASE LEAD CONNECTION

(71) Applicant: Remy Technologies, LLC, Pendleton, IN (US)

(72) Inventor: Michael D. Bradfield, Anderson, IN (US)

(73) Assignee: BORGWARNER INC., Auburn Hills, MI (US)

( * ) Notice: Subject to any disclaimer, the term of this patent is extended or adjusted under 35 U.S.C. 154(b) by 309 days.

(21) Appl. No.: 14/876,763

(22) Filed: Oct. 6, 2015

(65) Prior Publication Data

US 2016/0105081 A1   Apr. 14, 2016

Related U.S. Application Data

(60) Provisional application No. 62/061,375, filed on Oct. 8, 2014.

(51) Int. Cl.
*H02K 9/04* (2006.01)
*H02K 9/19* (2006.01)
(Continued)

(52) U.S. Cl.
CPC ............. *H02K 9/04* (2013.01); *H02K 5/10* (2013.01); *H02K 9/14* (2013.01); *H02K 9/19* (2013.01);
(Continued)

(58) Field of Classification Search
CPC .. H02K 9/04; H02K 5/10; H02K 9/14; H02K 9/19; H02K 11/0068; H02K 11/33;
(Continued)

(56) References Cited

U.S. PATENT DOCUMENTS 6,424,063 B1    7/2002  Whitener et al.
8,544,575 B1 *  10/2013 Scaringe ............... B60K 6/485
                                                    180/65.21
(Continued)

OTHER PUBLICATIONS

International Search Report and Written Opinion; PCT/US2015/054329; dated Jan. 15, 2016; 9 pages.

*Primary Examiner* — Forrest M Phillips
(74) *Attorney, Agent, or Firm* — Bose McKinney & Evans LLP

(57) ABSTRACT

An electronic package connectable to an electric machine. The electronic package includes a support structure with a first axial end engaged with the electric machine. The support structure circumscribes the central axis and defines radially inner and outer wall surfaces. Power modules are disposed on and circumferentially distributed about the radially outer wall surface and include a power electronics device. Each module includes a phase terminal coupled with the power electronics device and disposed radially outwardly of the radially outer wall surface. The support structure defines a plurality of voids extending between the radially inner and outer wall surfaces. Each of the power modules are positioned proximate a separate one of the voids. Each void has a phase lead extending therethrough. Each phase lead is connected to a phase terminal and conductively couples it with a stator winding. An electric machine having an electronic package is also disclosed.

20 Claims, 34 Drawing Sheets

(51) Int. Cl.
*H02K 11/00* (2016.01)
*H05K 7/14* (2006.01)
*H05K 7/20* (2006.01)
*H02K 5/10* (2006.01)
*H02K 9/14* (2006.01)
*H02K 11/33* (2016.01)
*H02K 9/22* (2006.01)
*H02K 5/18* (2006.01)

(52) U.S. Cl.
CPC ......... *H02K 11/0068* (2013.01); *H02K 11/33* (2016.01); *H05K 7/1427* (2013.01); *H05K 7/20127* (2013.01); *H05K 7/20136* (2013.01); *H05K 7/20254* (2013.01); *H05K 7/20509* (2013.01); *H02K 5/18* (2013.01); *H02K 9/22* (2013.01)

(58) Field of Classification Search
CPC .......... H02K 5/18; H02K 9/22; H05K 7/1427; H05K 7/20127; H05K 7/20136; H05K 7/20254; H05K 7/20509

USPC ...................................................... 310/68 R
See application file for complete search history.

(56) References Cited

U.S. PATENT DOCUMENTS

| | | |
|---|---|---|
| 2003/0011253 A1 | 1/2003 | Kalsi et al. |
| 2011/0304226 A1 | 12/2011 | Bradfield |
| 2013/0342051 A1 | 12/2013 | Leung et al. |
| 2014/0175916 A1 | 6/2014 | Chamberlin et al. |
| 2016/0072359 A1* | 3/2016 | Kreidler ................ H02K 21/24 310/68 D |
| 2016/0226334 A1* | 8/2016 | Falguier .................. H02K 5/20 |
| 2016/0276895 A1* | 9/2016 | Aizawa .................. H02K 3/522 |
| 2017/0077779 A1* | 3/2017 | Hanioka ................. H02K 5/18 |

* cited by examiner

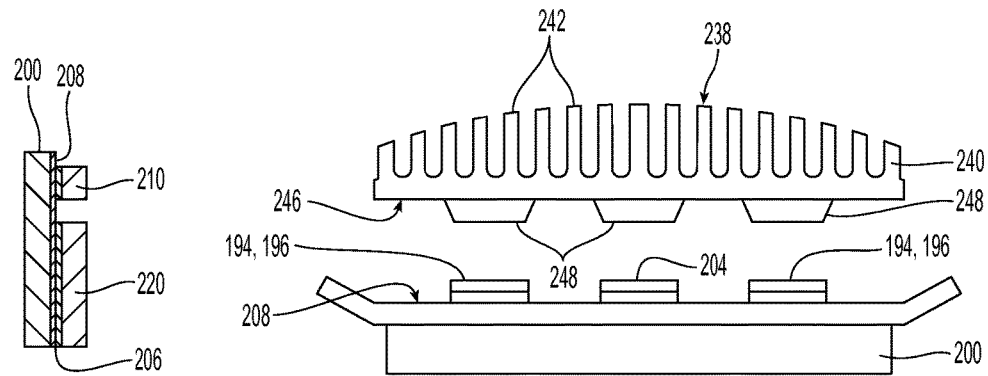
Fig. 29
Fig. 35
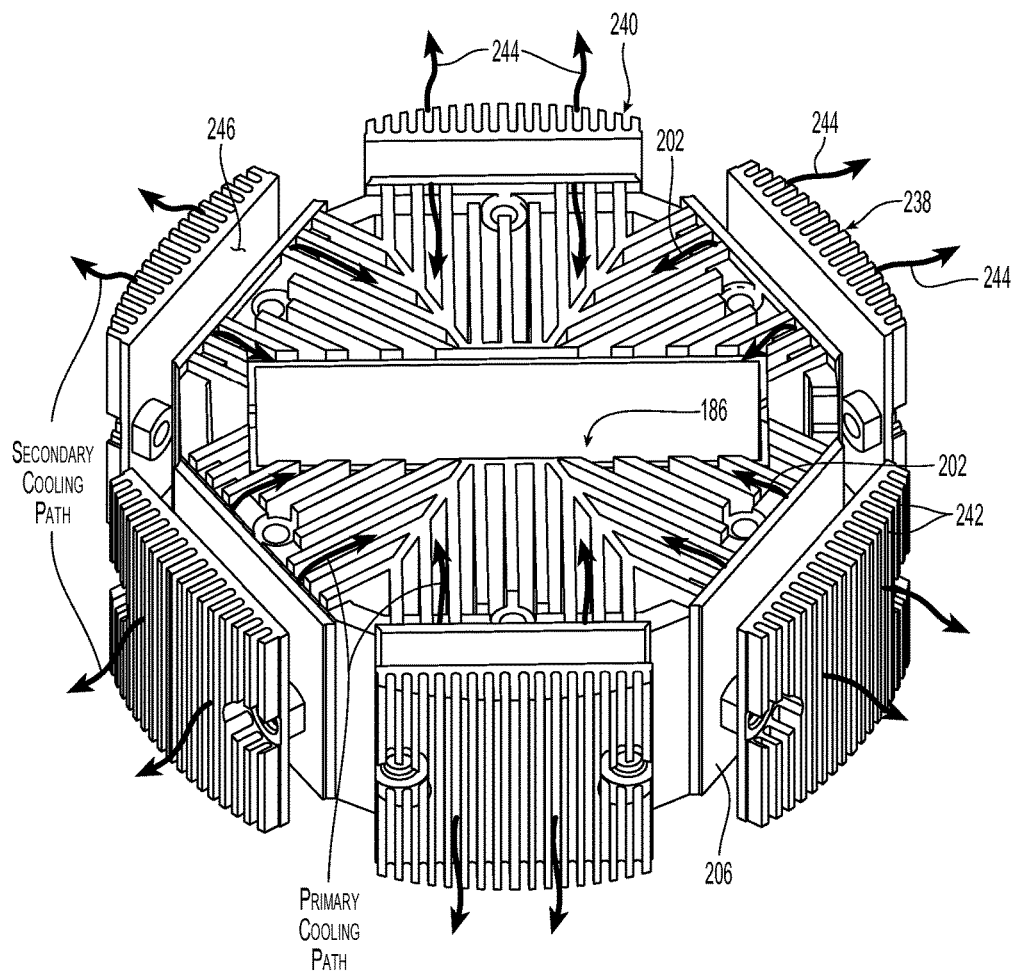
Fig. 36

RADIALLY ADAPTABLE PHASE LEAD CONNECTION

PRIORITY CLAIM AND CROSS-REFERENCE TO RELATED APPLICATIONS

This application claims the benefit, under Title 35, U.S.C. § 119(e), of U.S. Provisional Patent Application Ser. No. 62/061,375 entitled RADIALLY ADAPTABLE PHASE LEAD CONNECTION, filed Oct. 8, 2014; and is related to U.S. patent application Ser. No. 14/877,850 entitled DUAL AIR AND LIQUID COOLING MEDIA COMPATIBLE ELECTRIC MACHINE ELECTRONICS, filed Oct. 7, 2015; U.S. patent application Ser. No. 14/876,821 entitled AXIALLY EXTENDING ELECTRIC MACHINE ELECTRONICS COOLING TOWER, filed Oct. 7, 2015; U.S. patent application Ser. No. 14/876,823 entitled BI-DIRECTIONAL MOSFET COOLING FOR AN ELECTRIC MACHINE, filed Oct. 7, 2015; U.S. patent application Ser. No. 14/876,825 entitled CIRCUIT LAYOUT FOR ELECTRIC MACHINE CONTROL ELECTRONICS, filed Oct. 7, 2015; U.S. patent application Ser. No. 14/876,566 entitled CENTRALLY LOCATED CONTROL ELECTRONICS FOR ELECTRIC MACHINE, filed Oct. 6, 2015; and U.S. patent application Ser. No. 14/876,674 entitled PEDESTAL SURFACE FOR MOSFET MODULE, filed Oct. 6, 2015, the entire disclosures of which are incorporated herein by reference.

BACKGROUND

Vehicles, such as those employing an internal combustion engine and/or having a hybrid drive train that includes an electric machine, often employ what are commonly referred to as alternators.

Vehicle alternators are electric machines that selectively function as a generator or an electric motor. In conventional internal combustion engine drive vehicles, alternators are employed as an electric motor to provide torque to the engine when starting the engine. After the engine has been started, the alternator can function as a generator to generate current to recharge the vehicle battery. In hybrid vehicles, the alternator may be used as an electric motor to additionally provide torque for driving the vehicle.

The electrical circuitry employed with alternators can generate significant heat that must be dissipated. As modern vehicles place greater demands on alternators, the demands on the alternator circuitry also increases. Improvements which address the increased demands on electric machines such as those which are used as vehicle alternators are desirable.

SUMMARY

The present invention provides an electronic package for an electric machine wherein the electronic packages has a support structure with voids for phase leads that enhances the functionality of the electric machine.

The invention comprises, in one form thereof, an electronic package adapted for connection to a rear frame member of an electric machine wherein the electric machine includes a stator having a plurality of stator windings and a rotor rotatable about a central axis. The electronic package includes a support structure having opposite first and second axial ends. The first axial end is adapted for engagement with the rear frame member with the support structure circumscribing the central axis. The support structure defines a radially inner wall surface and a radially outer wall surface. A plurality of power modules are disposed on and circumferentially distributed about the radially outer wall surface. Each of the power modules includes a power electronics device. Each of the power modules also includes a phase terminal that is coupled with the power electronics device and which is disposed radially outwardly of the radially outer wall surface. The support structure defines a plurality of voids extending between the radially inner wall surface and the radially outer wall surface wherein each of the plurality of power modules are positioned proximate a separate one of the plurality of voids. A plurality of phase leads are provided with each of the plurality of phase leads extending through one of the plurality of voids and being connected to one of the phase terminals whereby each of the phase terminals is conductively couplable with a respective one of the stator windings of the electrical machine.

In some embodiments of the electronic package, the plurality of voids are disposed at the first axial end of the support structure and define a plurality of open ended slots on the first axial end of the support structure.

In some embodiments of the electronic package, the radially outer wall surface defines a plurality of circumferentially spaced planar mounting surfaces with each planar mounting surface engaging a respective one of the plurality of power modules. In an embodiment having such planar mounting surfaces, the radially outer wall surface may also define a plurality of discrete, radially outward projecting pedestals at circumferentially spaced locations wherein each of the projecting pedestals defines a respective one of the plurality of planar mounting surfaces.

In an embodiment of the electronic package having a plurality of pedestals, the plurality of voids may be disposed at the first axial end of the support structure and define a plurality of open ended slots on the first axial end of the support structure.

In an embodiment of the electronic package having a plurality of pedestals, the power modules may be substantially evenly distributed about the radially outer wall surface.

In some embodiments of the electronic package, the support structure is formed out of a metal material and defines a heat sink in thermal communication with the plurality of power modules and the radially inner surface defines an air passage axially extending between the first and second axial ends of the support structure.

In some embodiments of the electronic package having a support structure that defines a heat sink, the support structure further includes a plurality of spaced ribs in conductive thermal communication with the radially inner wall surface, the ribs being disposed within the air passage. In some embodiments having such ribs, the plurality of voids may be disposed at the first axial end of the support structure and define a plurality of open ended slots on the first axial end of the support structure.

Another embodiment takes the form of an electric machine that includes a stator, a rotor surrounded by and rotatable relative to the stator about a central axis, a rear frame member rotatably fixed relative to the stator and through which the central axis extends, and an electronic package as described herein and wherein the central axis extends through the support structure of the electronic package with the support structure being connected to the rear frame member.

In some embodiments of the electric machine, the plurality of voids are disposed at the first axial end of the support structure and define a plurality of open ended slots on the first axial end of the support structure.

In some embodiments of the electric machine, the electric machine is air-cooled and the rear frame member has an aperture through which cooling air flow is drawn generally axially, in the direction of the rotor relative to the electronic package, for cooling the electric machine at locations downstream of the aperture.

In some embodiments of the air-cooled electric machine, the support structure is formed out of a metal material and defines a heat sink in thermal communication with the plurality of power modules wherein the radially inner surface defines an air passage axially extending between the first and second axial ends of the support structure with the air passage at the first axial end of the support structure being in communication with the aperture in the rear frame member.

In some embodiments of the air-cooled electric machine wherein the support structure defines a heat sink, the support structure further includes a plurality of spaced ribs in conductive thermal communication with the radially inner wall surface with the ribs being disposed within the air passage. Such an embodiment may further include a fan rotatable with the rotor about the central axis wherein the air flow through the air passage and the aperture is induced by fan rotation. In such an embodiment, the plurality of voids may be disposed at the first axial end of the support structure and define a plurality of open ended slots on the first axial end of the support structure.

In some embodiments of the electric machine, the electric machine is liquid-cooled and the rear frame member defines a metallic wall extending substantially perpendicularly relative to the central axis wherein the rear frame member wall has an inner axial side in contact with liquid coolant and an opposite outer axial side in conductive thermal communication with the support structure.

BRIEF DESCRIPTION OF THE DRAWINGS

The various objects, features and attendant advantages of the present invention will become fully appreciated as the same becomes better understood when considered in conjunction with the accompanying drawings. Although the drawings represent embodiments of the disclosed apparatus, the drawings are not necessarily to scale or to the same scale and certain features may be exaggerated or omitted in order to better illustrate and explain the present disclosure. Moreover, in accompanying drawings that show sectional views, cross-hatching of various sectional elements may have been omitted for clarity. It is to be understood that this omission of cross-hatching is for the purpose of clarity in illustration only.

FIG. 29 is a cross-sectional view of a MOSFET module along line 29-29 of FIG. 28;

FIG. 35 is an axial view of a MOSFET module showing its respective power electronics devices, module housing cover, and the cover's integral bosses extending radially inward from the interior surface of the cover, with the module housing sidewalls omitted for clarity;

FIG. 36 is a rear perspective view of the electronic package as shown in FIG. 17, with portions of the MOSFET modules radially inward of their housing covers omitted, showing the bi-directional heat sinks of an electronic package according to the present disclosure, and paths of heat transfer from each MOSFET module into the main, cooling tower heat sink by conduction along a primary cooling path, and to ambient air via natural convection from the module housing covers along a parallel, secondary cooling path;

Figure 1:
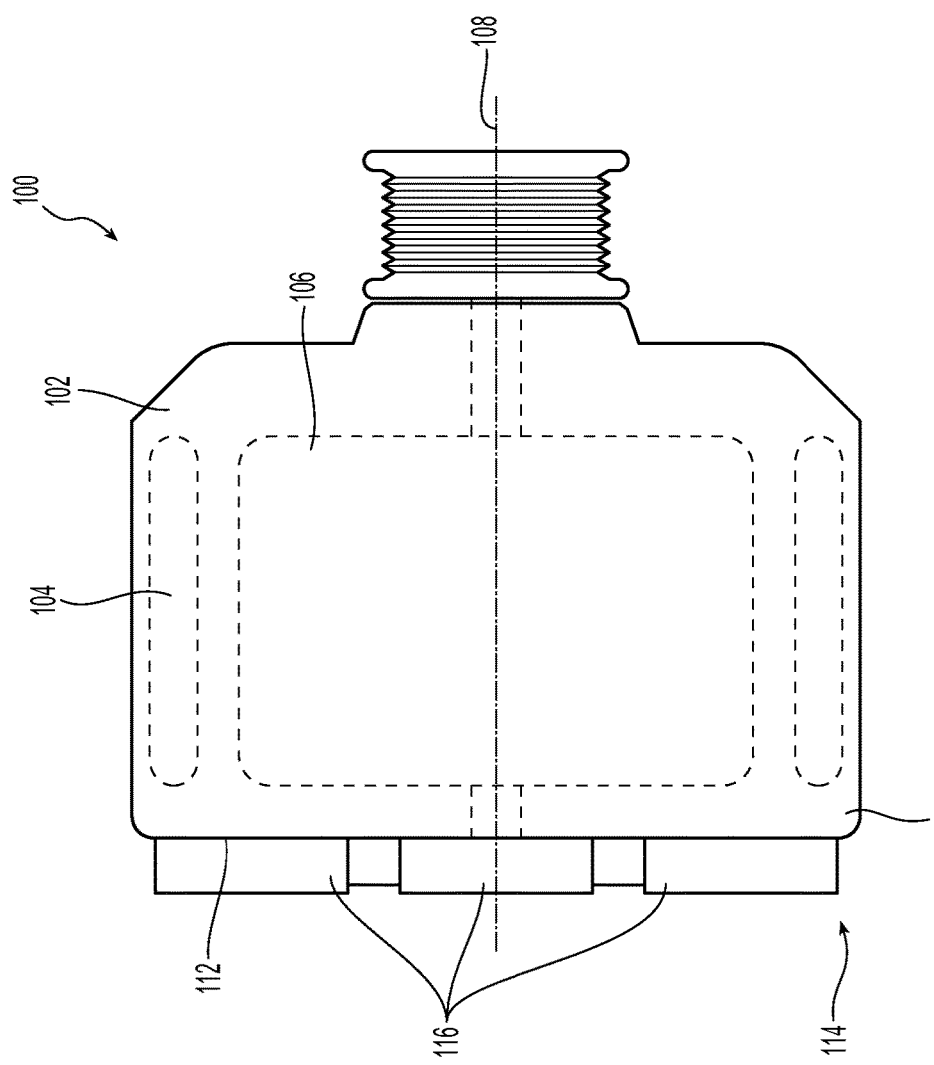
FIG. 1 is a side view of an alternator embodiment according to the prior art.

Corresponding reference characters indicated corresponding parts throughout the several views. Although the drawings represent embodiments of the disclosed apparatus, the drawings are not necessarily to scale or to the same scale and certain features may be exaggerated in order to better illustrate and explain the present disclosure.

DETAILED DESCRIPTION OF EXEMPLARY EMBODIMENT(S)

The invention is adaptable to various modifications and alternative forms, and the specific embodiments thereof shown by way of example in the drawings is herein described in detail. The exemplary embodiments of the present disclosure are chosen and described so that others skilled in the art may appreciate and understand the principles and practices of the present disclosure. It should be understood, however, that the drawings and detailed description are not intended to limit the invention to the particular forms disclosed, but on the contrary, the intention is to cover all modifications, equivalents and alternatives falling within the spirit and scope of the present invention as defined by the appended claims.

It shall be understood that the terms "radial" and "axial" are generally used herein to establish positions of individual components relative to the central axis of an electric machine or electronic package, rather than an absolute position in space. Further, regardless of the reference frame, in this disclosure terms such as "parallel" and "perpendicular" and the like are not used to connote exact mathematical orientations or geometries, unless explicitly stated, but are instead used as terms of approximation. Terms such as "forward," "rearward," "front," and "rear" and the like are used in the context of the central axis extending between opposite front/forward and rear/rearward axial ends. Further, it should be understood that various structural terms used throughout this disclosure and claims should not receive a singular interpretation unless it is made explicit herein.

Figure 3:
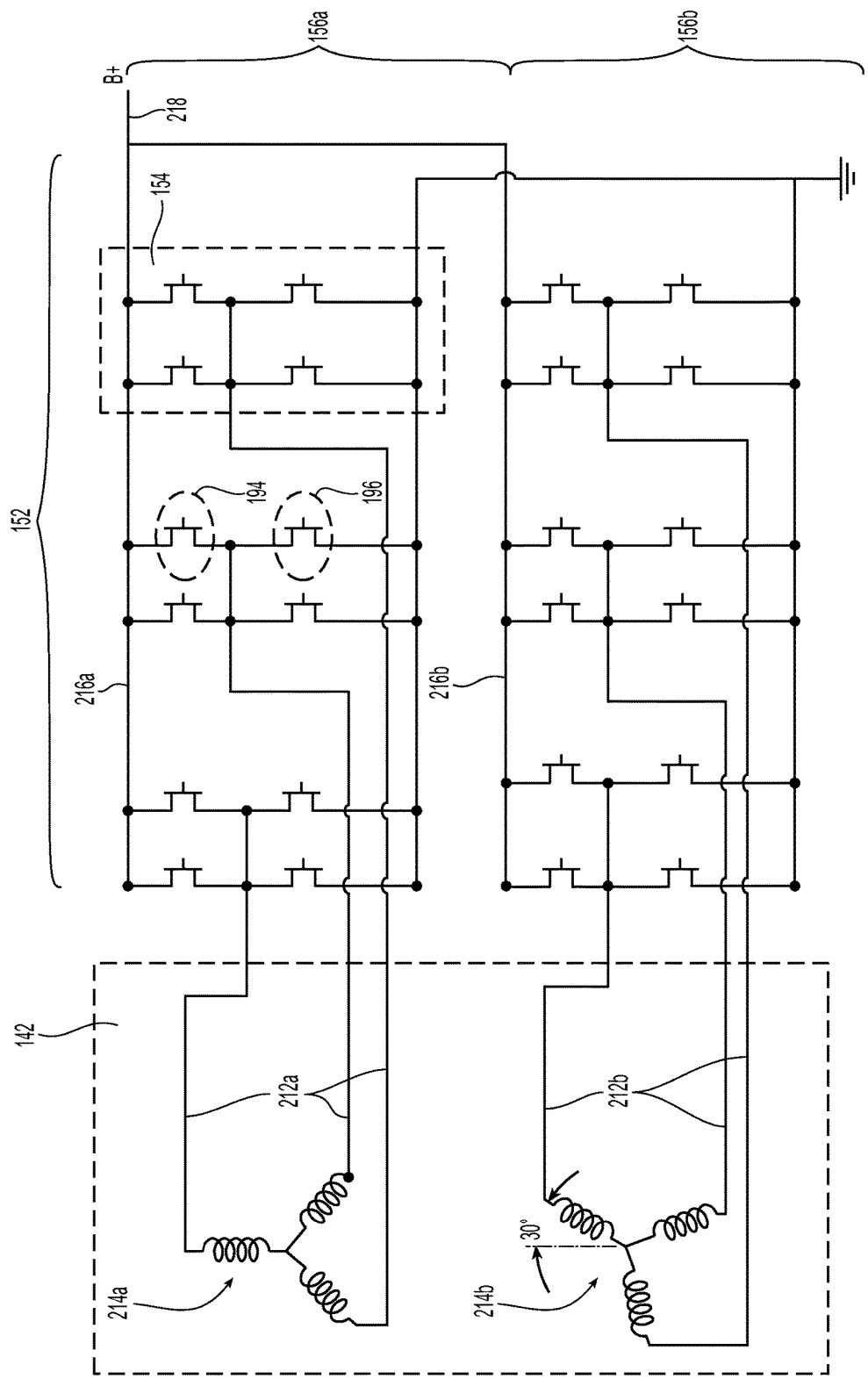
FIG. 3 is an electrical schematic of a typical alternator's power electronics.

Although the disclosed embodiment relates to three-phase or six-phase (i.e., dual three-phase) synchronous machine topologies such as claw pole alternators and internal permanent magnet hybrid machines, the present disclosure could also be applied to other machine topologies such as switched reluctance or induction. Those having ordinary skill in the art will understand the above-mentioned six-phase (i.e., dual three-phase) machines are of the type having two, three-phase windings that are 30 degrees electrically apart for noise cancellation, as shown in FIG. 3. It is to be understood, however, that all aspects of the disclosure provided herein also relate and could be applied to pure six-phase machines as well as to five-phase machines or seven-phase machines, which are electric machine types well-known to those having ordinary skill in the relevant art.

Figure 4:
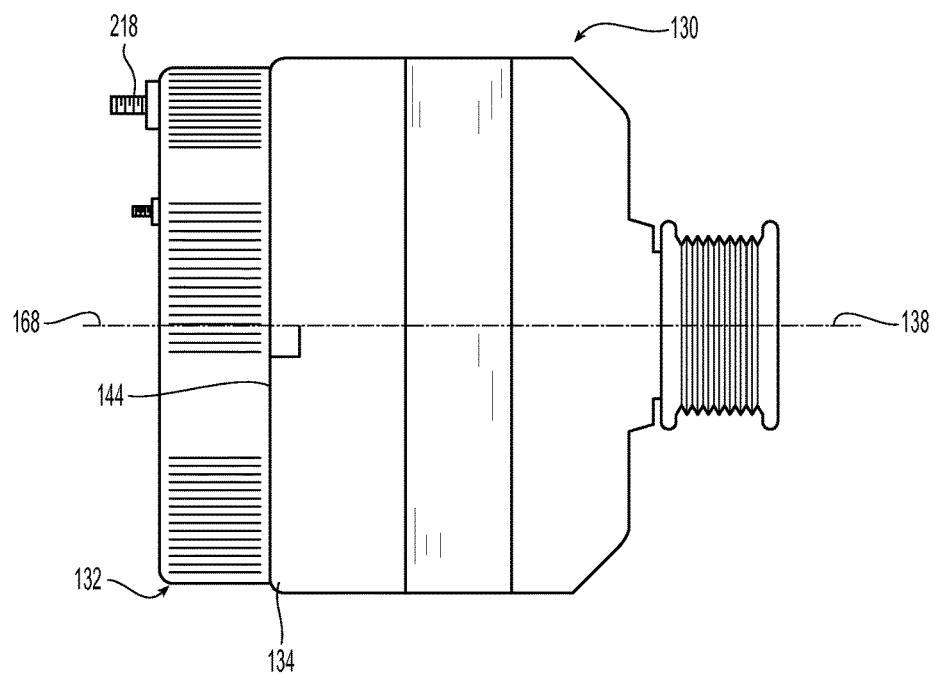
FIG. 4 is a side view of an alternator including an embodiment of an integrated electronics assembly or "electronic package" according to the present disclosure mounted on the back face of the alternator's rear frame member.

The electric machine embodiments 130 exemplified herein have an intended power range of 1.5 to 17 kW, a voltage range of 12-60V, and stator outside diameters ranging between 120 and 200 mm. Referring to FIG. 4, the exemplary electronic package embodiments 132 disclosed herein are integrated electronic assemblies packaged as separable electric machine components adapted for being mounted to a rear frame member 134 of an electric machine 130, at the axially rearmost portion of the machine, relative to the machine's normal orientation as typically installed. Typically, the rear frame of an electric machine radially and axially supports the rotor shaft 136 relative to the machine central axis 138 through a bearing. The rotor 140 may itself define the machine central axis 138, as may the stator 142. Integrated control and power electronics for electric machines are commonly located rearward of the stator and rotor, and mounted to the rear frame. A prior electric machine 100 including its integrated control and power electronics package 114 is shown in FIG. 1.

Cooling of the integrated electronics of prior electric machines typically relies at least in part on the means provided for cooling other components of the machine located internally of the machine housing, such as the stator windings or the rotor. Certain aspects of the invention(s) disclosed herein relate to the electronic package being mounted at the rear of an electric machine.

Figure 10:
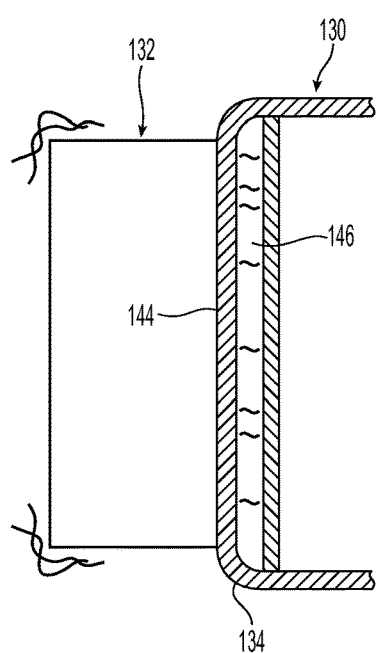
FIG. 10 shows liquid-cooling and air-cooling of the integrated electronics in an electric machine embodiment according to the present disclosure.
Figure 11:
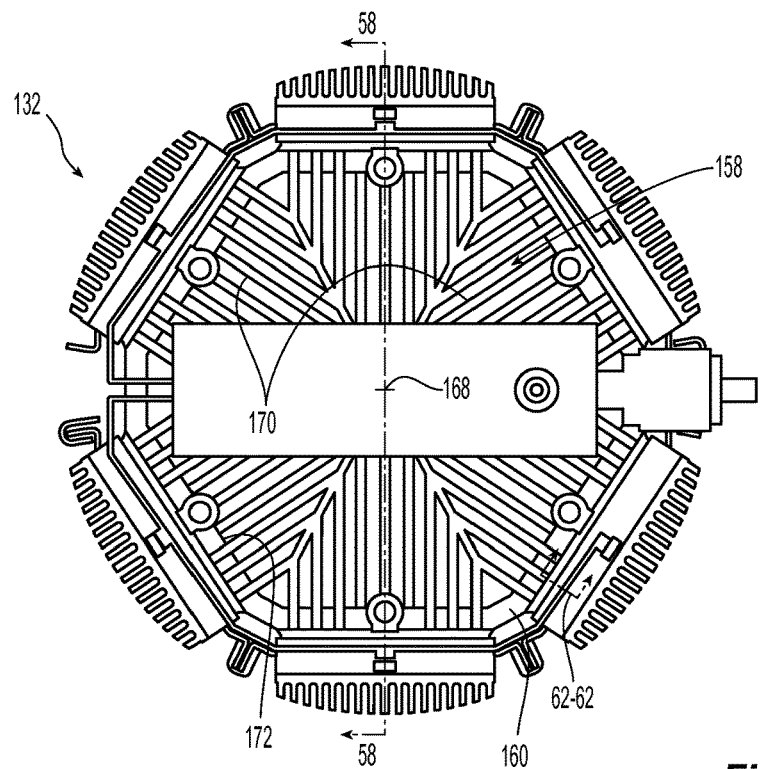
FIG. 11 is an axial rear view of the electronic package of FIG. 5 with its cover removed.
Figure 12:
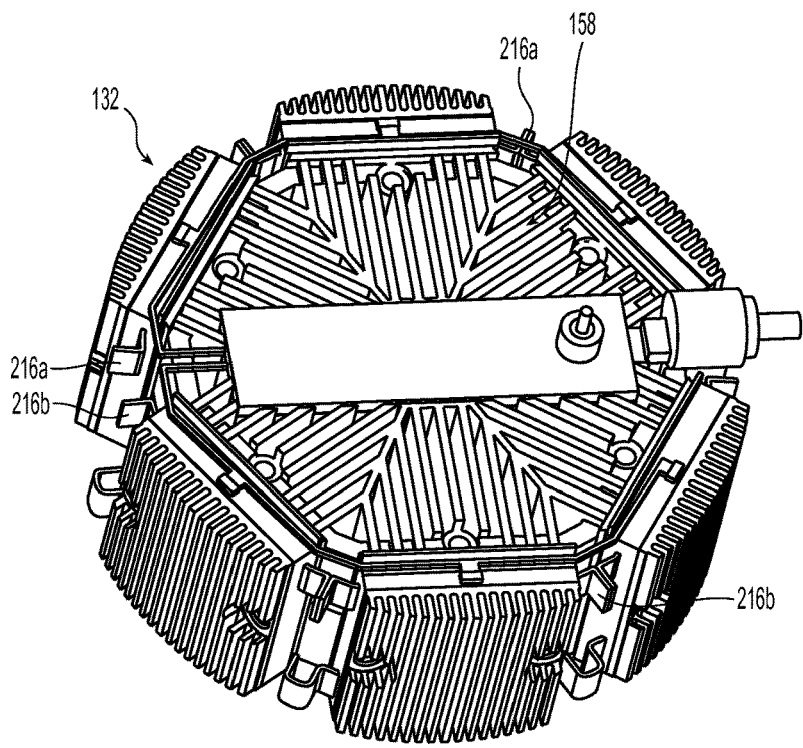
FIG. 12 is a rear perspective view of the electronic package as shown in FIG. 11.
Figure 13:
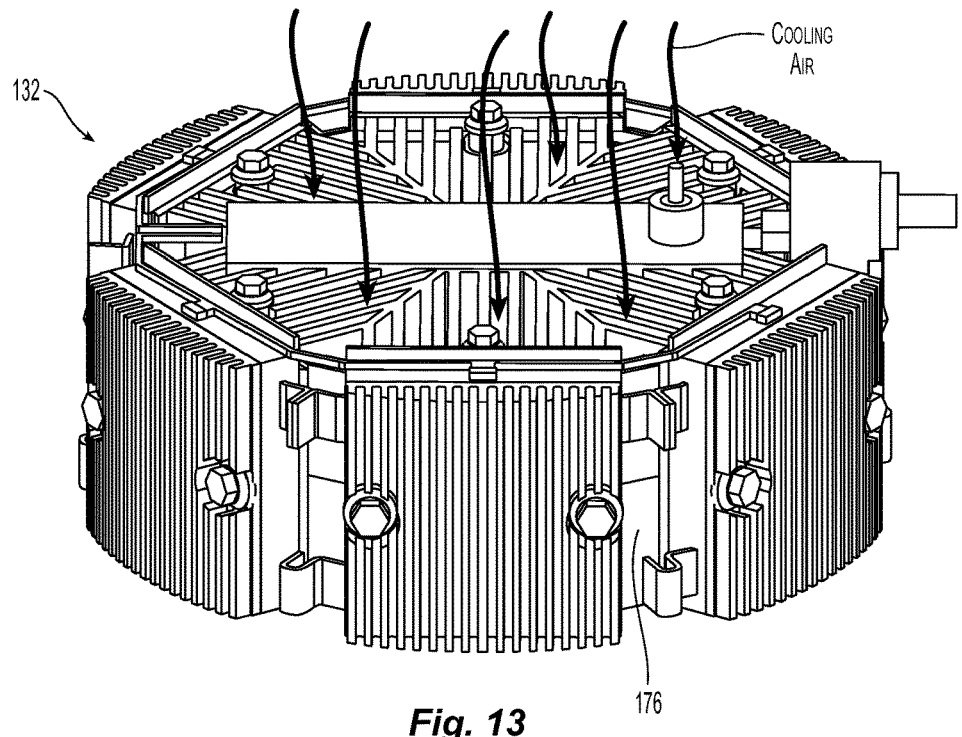
FIG. 13 is another rear perspective view of the electronic package as shown in FIG. 11, showing the ingress of cooling air.
Figure 14:
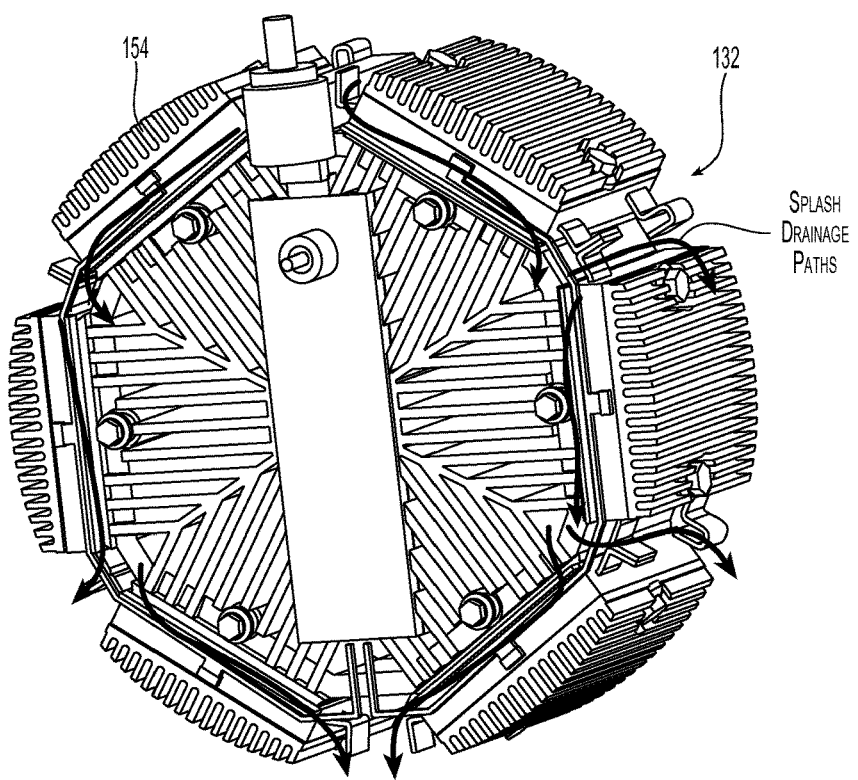
FIG. 14 is another rear perspective view of the electronic package as shown in FIG. 11, shown oriented as mounted to the rear frame member of an electric machine (not shown) in a normal installed position, showing splash drainage paths.
Figure 15:
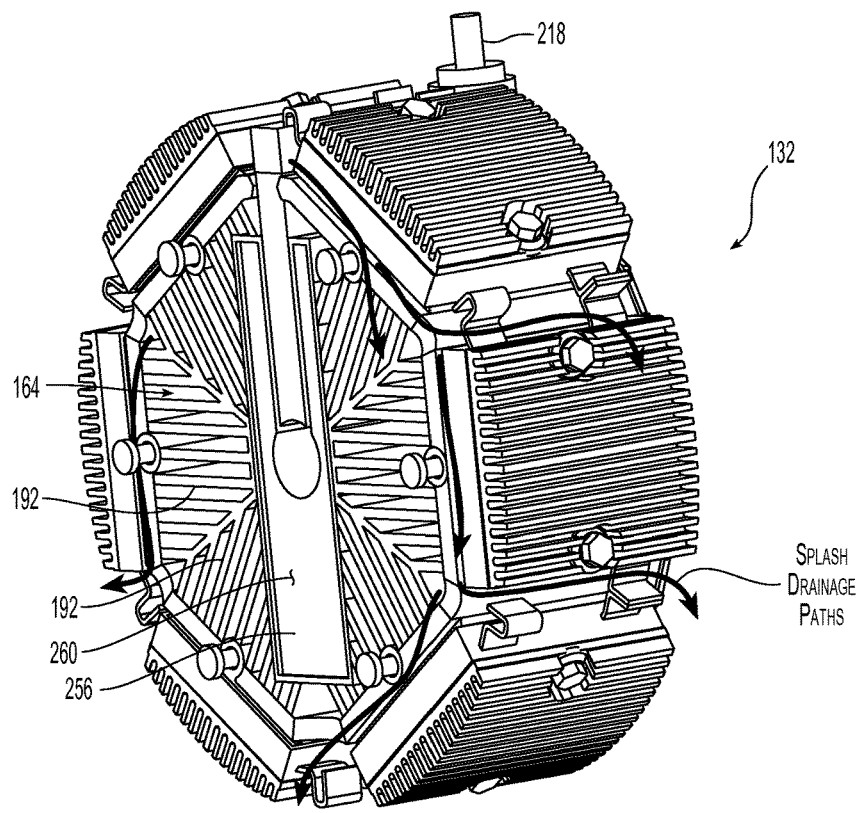
FIG. 15 is a front perspective view of the electronic package of FIG. 14, showing the axial end of the electronic package that interfaces with the rear frame member of the electric machine (not shown), showing splash drainage paths.
Figure 16:
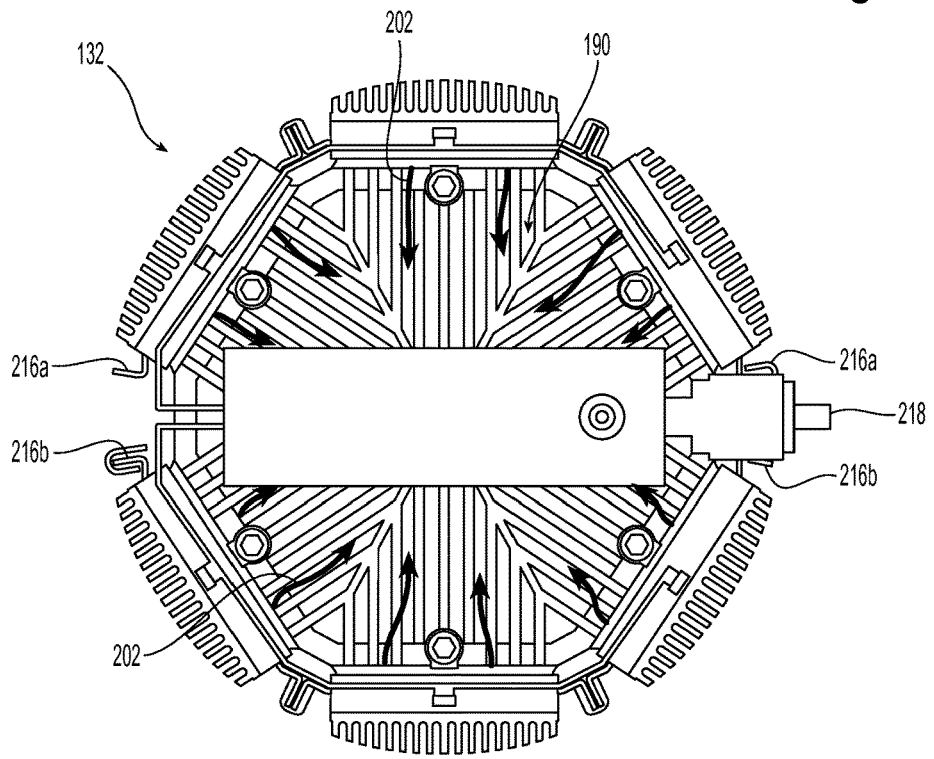
FIG. 16 is an axial rear view of the electronic package, similar to that of FIG. 11, showing radially inward conductive heat flow from the its power electronics modules to its main, cooling tower heat sink along a primary cooling path.
Figure 17:
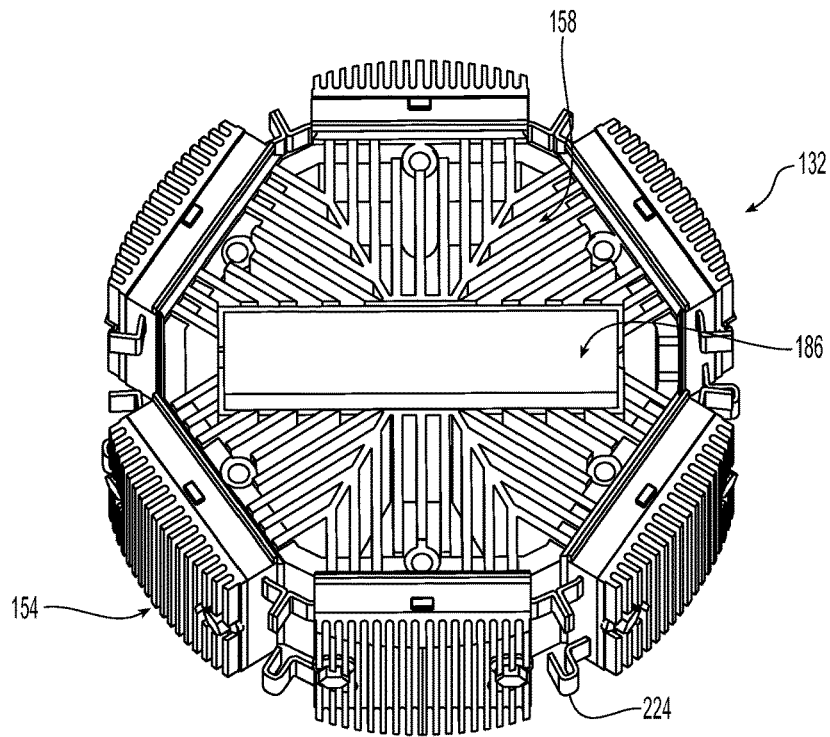
FIG. 17 is a rear perspective view of the electronic package, similar to that of FIG. 13, but with the control electronics assembly and B+ terminal omitted.
Figure 18:
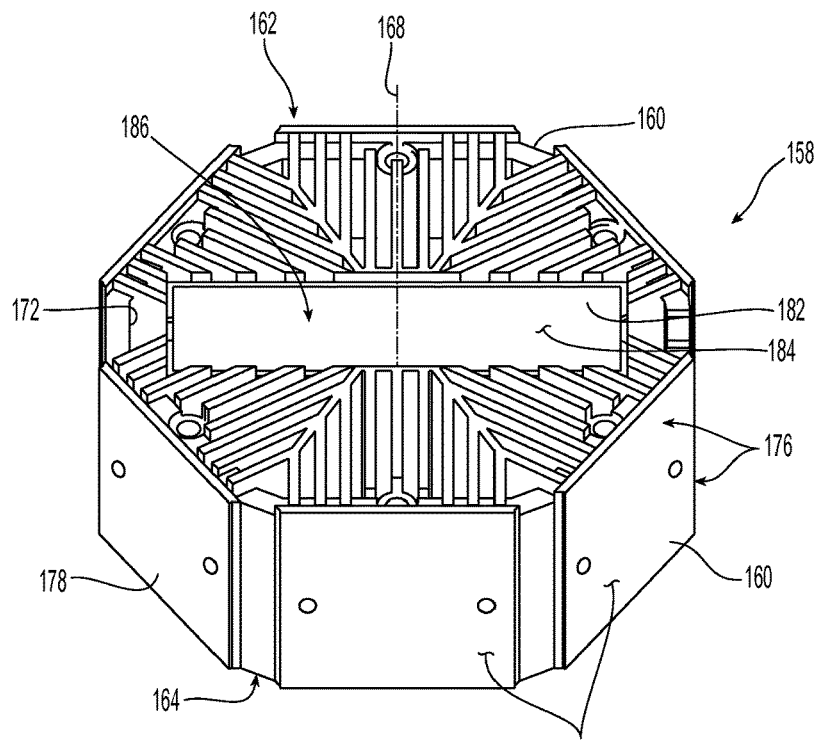
FIG. 18 is a rear perspective view of the cooling tower of the electronic package of FIG. 5.
Figure 19:
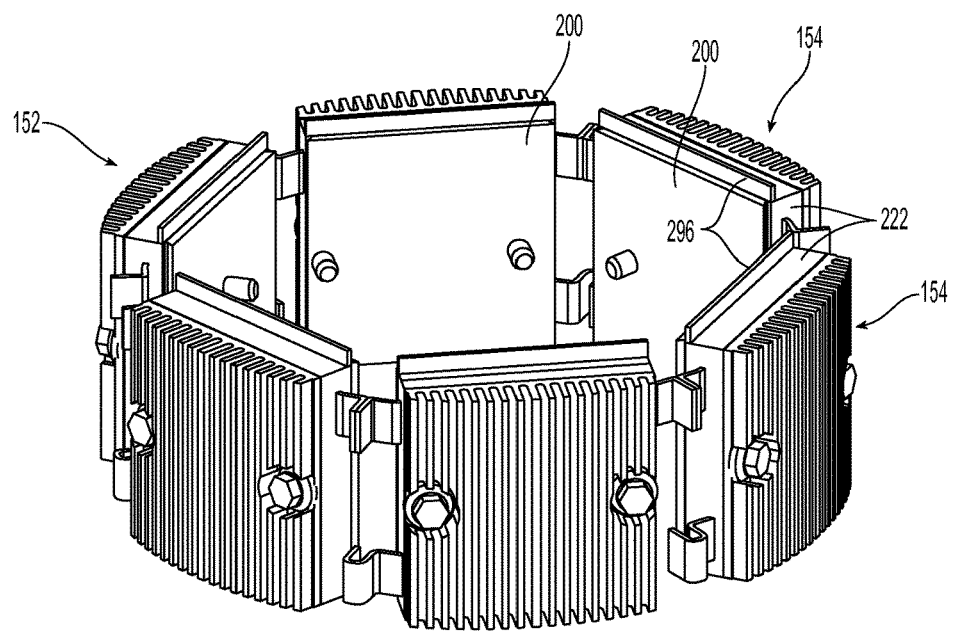
FIG. 19 is a rear perspective view of the interconnected MOSFET modules of the electronic package of FIG. 5, arranged relative to each other in their installed positions.

The rear frame may include a member 134 defining a generally planar back face 144 that extends perpendicularly relative to the central axis 138. Liquid-cooled electric machines often provide a liquid coolant passage or water jacket portion 146 in the rear frame, located axially inside the back face 144. Such a machine according to the present disclosure is shown in FIG. 10.

Figure 8:
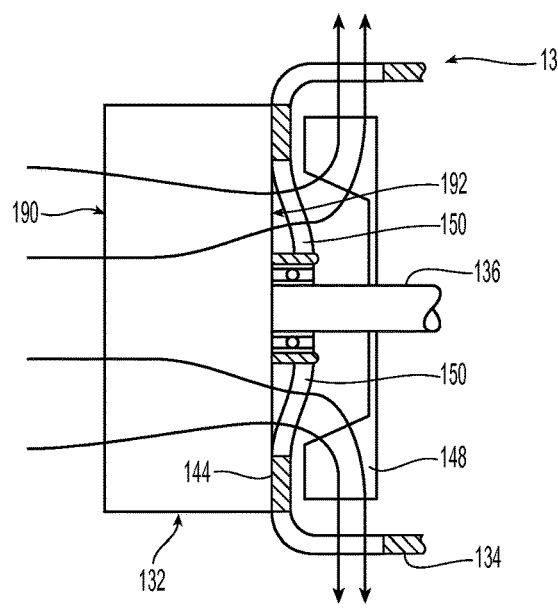
FIG. 8 shows air-cooling of the integrated electronics utilizing the rearmost of dual internal fans in an electric machine embodiment according to the present disclosure.

Referring to FIG. 8, the rear frame member 134 may house one of a pair of internal fans 148 rotatable with the rotor 140. The rear fan 148 induces air flow in a forward direction from the rear of the machine 130, axially inwardly towards the rotor 140, through apertures 150 in the rear frame member 134. Air drawn axially into the internal rear fan 148 is directed radially outwardly, usually past the stator windings which are cooled thereby, and expelled radially from the machine 130.

Figure 9:
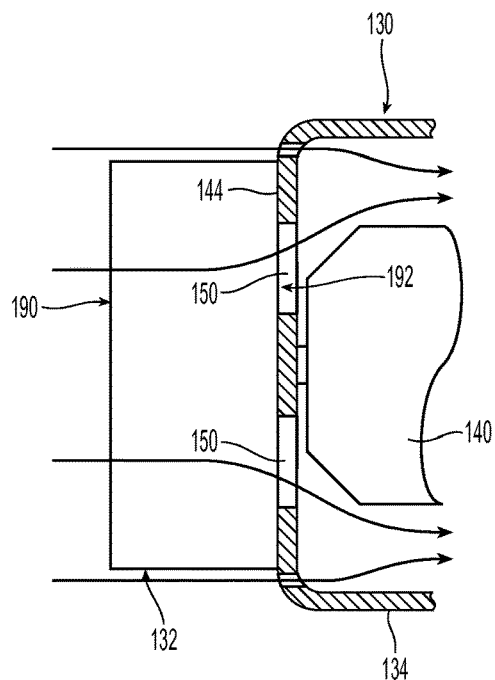
FIG. 9 shows air-cooling of the integrated electronics utilizing an external front fan and/or peripheral airflow in an electric machine embodiment according to the present disclosure.

Referring to FIG. 9, some electric machine embodiments 130 utilize an external fan (not shown), rotatable with the rotor 140 and located axially forward of the stator 142, to draw air through openings in the machine housing. The external fan induces a forwardly directed air flow through apertures 150 in the rear frame member 134 and past the stator and the rotor.

Figure 2:
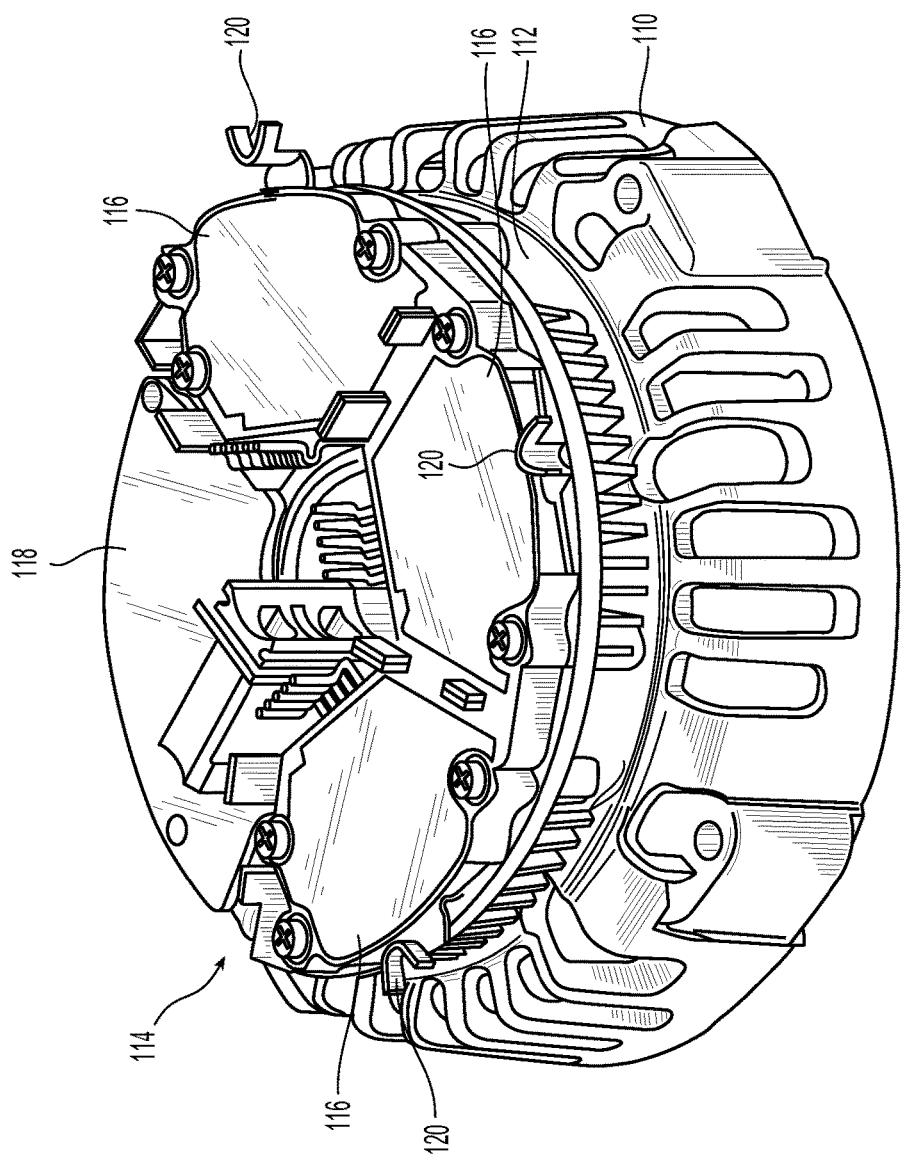
FIG. 2 shows a typical layout of a prior alternator's power and control electronics, disposed on the back face of the alternator's rear frame member.
Figure 5:
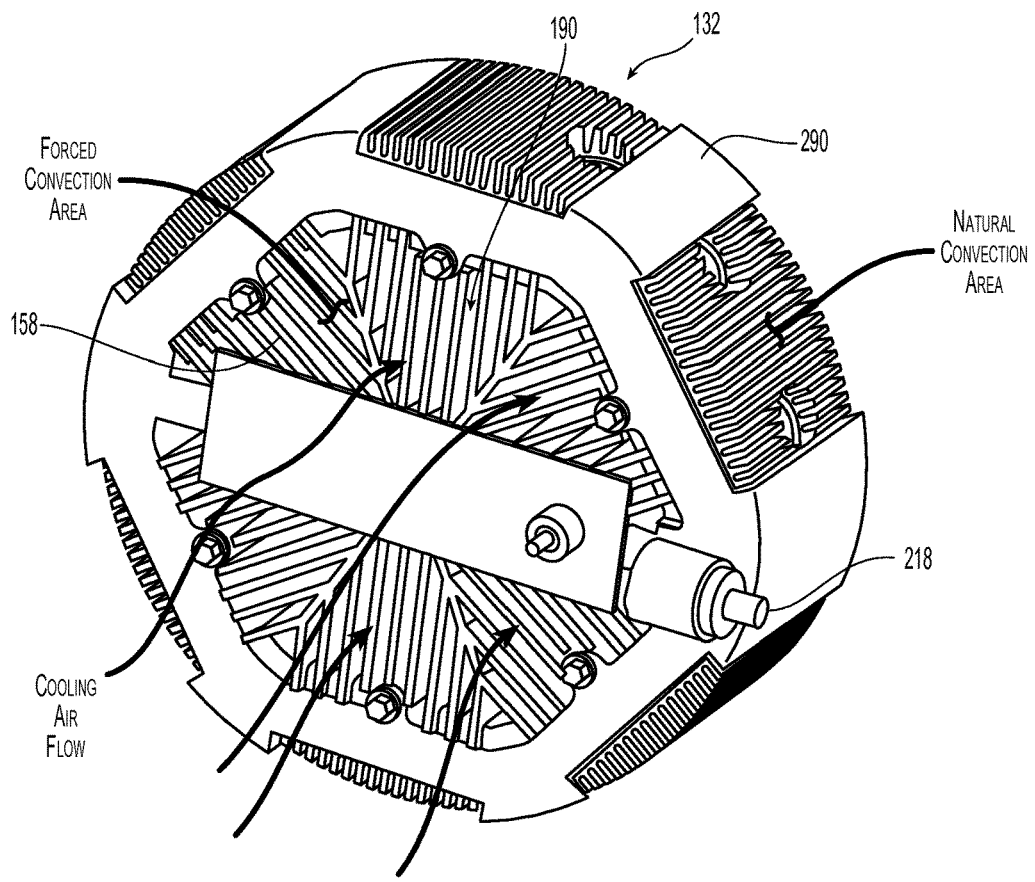
FIG. 5 is a rear perspective view of an electronic package according to the present disclosure showing paths of air flow and forced convection areas, and areas of natural convection.
Figure 6:
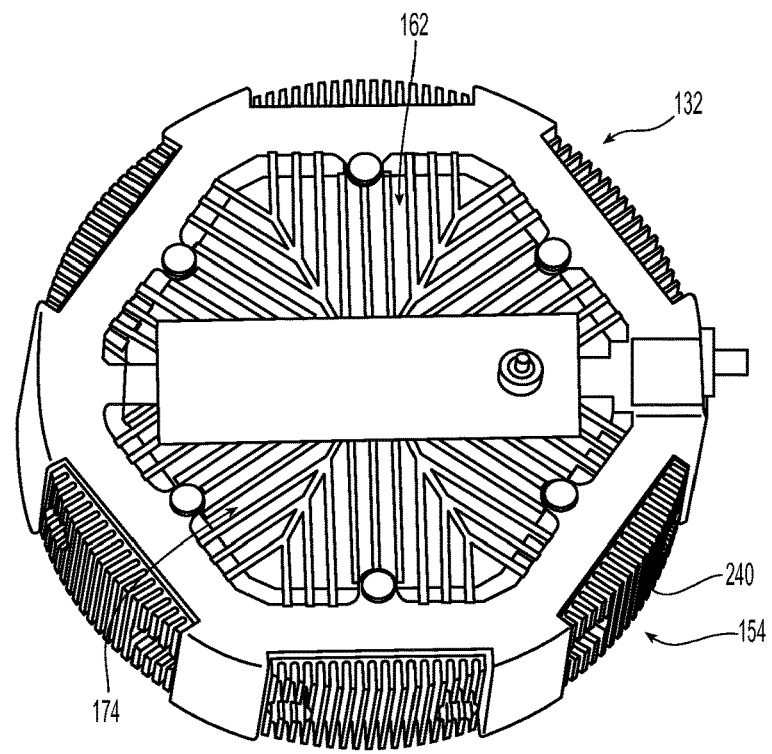
FIG. 6 is another rear perspective view of the electronic package of FIG. 5.
Figure 7:
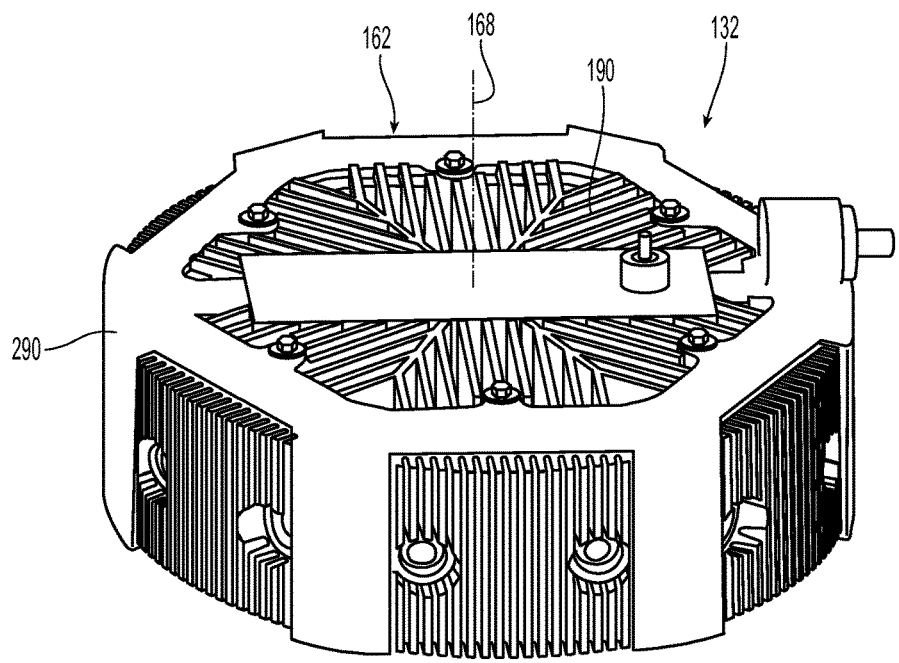
FIG. 7 is another rear perspective view of the electronic package of FIG. 5.

Referring to FIGS. 5 and 6, the spatial arrangement of the components in an electronic package 132 according to the present disclosure maximizes the use of available package space. The exemplary embodiments provide power electronics devices 154 as power modules 154 or MOSFET modules 154 providing two parallel sets 156a, 156b of three-phase MOSFET rectifier/inverters 154, as shown in FIG. 3. Prior electric machine 100 designs (see, e.g., FIGS. 1 and 2) representative of the current state of the art physically do not allow paralleling the power electronic devices. These prior machines utilize three MOSFET modules 116 arranged along with the control electronics 118 on the back face 112 of the rear frame 110, generally as shown in FIG. 2. The lack of physical room available at this site precludes packaging paralleled MOSFET rectifiers/inverters there. Contradistinctively, electric machine embodiments 130 according to the present disclosure accommodate the packaging of six MOSFET modules 154, provided as two parallel-connected sets 156a, 156b of three modules 154 as shown in FIG. 3. Relative to the power electronics 116 of current state of the art machines 100 of similar capacity, these two sets 156a, 156b of power modules 154 effectively reduce the current therethrough by approximately half, since they are in parallel.

In the example of a three-phase electric machine 130 that operates in a generating mode to produce 200 A of DC output current, a machine 100 designed according to the current state of the art would have 200 A flowing through each of its three MOSFET modules 116 for ⅓ of the time to rectify the stator output, whereas a machine 130 according to an embodiment of the present disclosure each MOSFET module 154 need only rectify 200 A/2 or 100 A. MOSFET loss is an ohmic type loss whereby the heat loss is proportional to current squared. Thus, compared to the prior state of the art electric machine 100, an electric machine 130 according to the present disclosure, owing to its paralleled power electronics devices 154, effectively cuts the power loss in each power electronics device 154 by $¼^{th}$ (i.e., by $½^2$) and the overall heat loss in the power electronics in half (i.e., $¼×2=½$), a result providing significant advantages vis-à-vis comparable prior electric machines 100.

Referring to FIGS. 1 and 2, in a typical prior air-cooled electric machine 100, the cooling air enters axially into the rear of the machine. However, the power and control electronics components 114 of these machines essentially consume the entire back face area of the machine's rear frame 110, and does not permit sufficient axial air flow past the electronics for air cooling them. Heat from the power modules 116 must travel along the back face plane before reaching the cooling fins, which are located outside of the power modules. This travel distance adds thermal conduction resistance and raises the temperature of the power devices 116 accordingly.

Moreover, fins for cooling the power modules of these prior machines are not in an area of high velocity inlet air flow, and/or do not work in concert with the natural flow path of the incoming air, instead raising air flow resistance and thus lowering overall bulk cooling air flow rates.

According to another prior cooling approach, the power electronics 116 and control electronics 118 are spaced axially apart in the machine 100 and cooling air is drawn through radial inlets into the machine before turning and flowing axially within the machine. This type of layout, however, induces high pressure drops due to turning the cooling air flow, and thus reduces the bulk air flow rate. This layout also promotes recirculation of hot air exhausted from the rear of the machine 100 back into its radial cooling air inlets. This recirculation effectively raises the temperature of cooling air drawn into the machine 100, thus raising component temperatures. These problems are overcome in an electric machine 130 according to the present disclosure.

Figure 20:
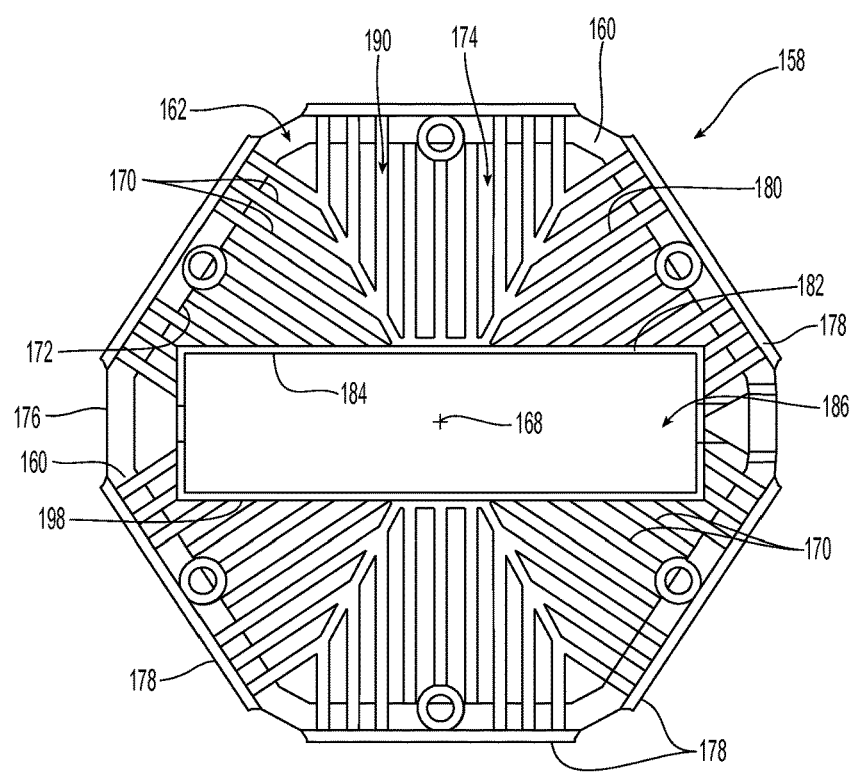
FIG. 20 is an axial rear view of the cooling tower of FIG. 18.
Figure 21:
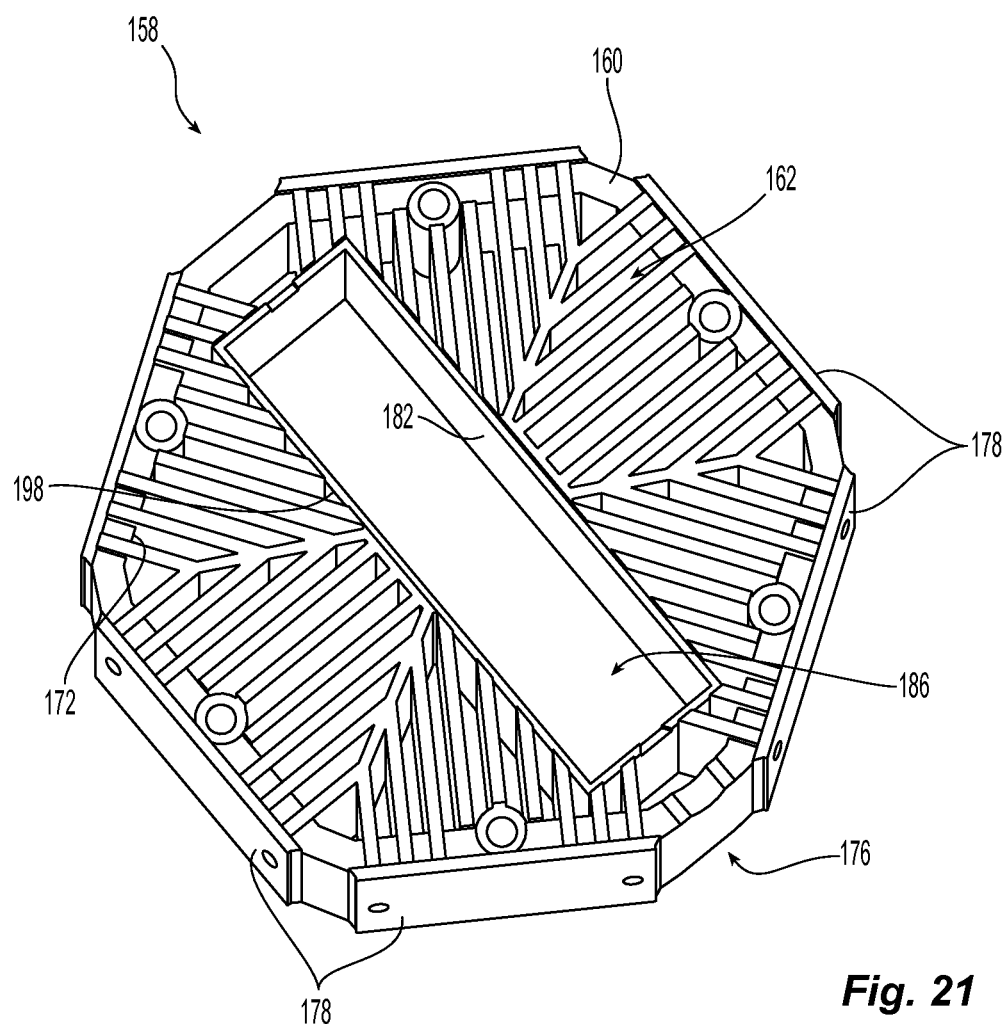
FIG. 21 is another rear perspective view of the cooling tower of FIG. 18.
Figure 22:
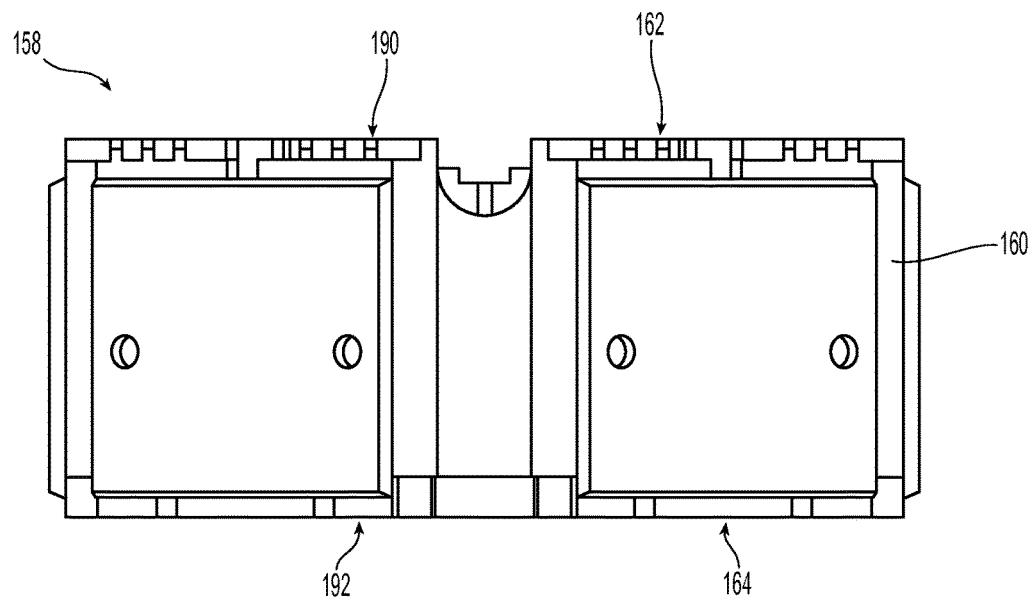
FIG. 22 is a side view of the cooling tower of FIG. 18.
Figure 23:
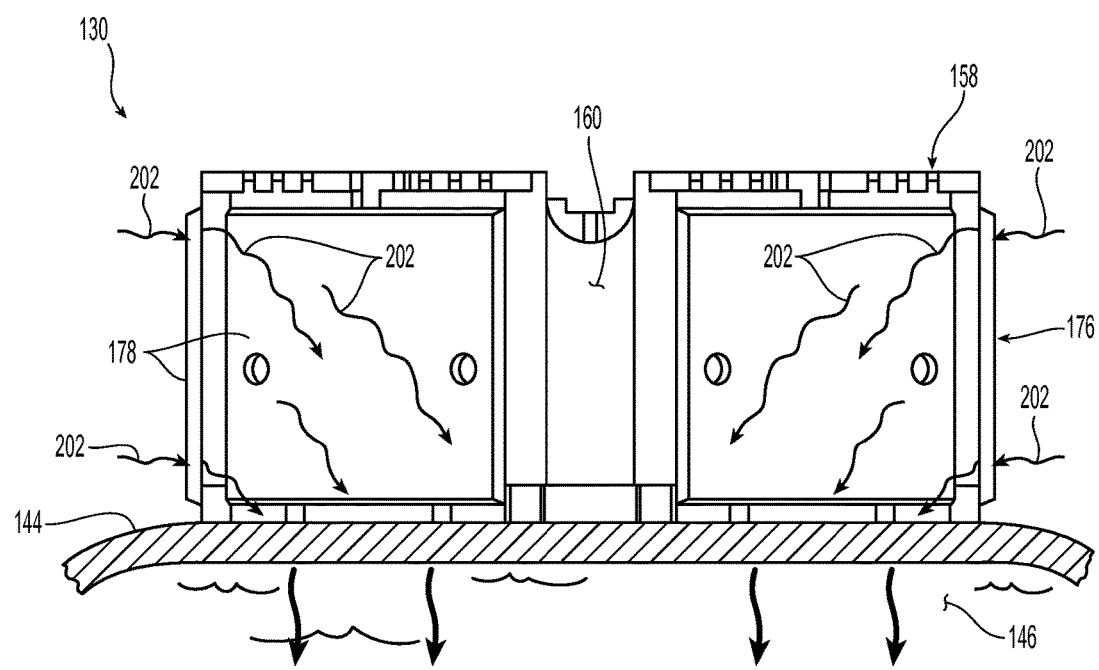
FIG. 23 is a partial and partly sectioned view of a liquid-cooled embodiment of an electric machine according to the present disclosure, showing heat flow through the cooling tower towards the machine's rear frame member.
Figure 24:
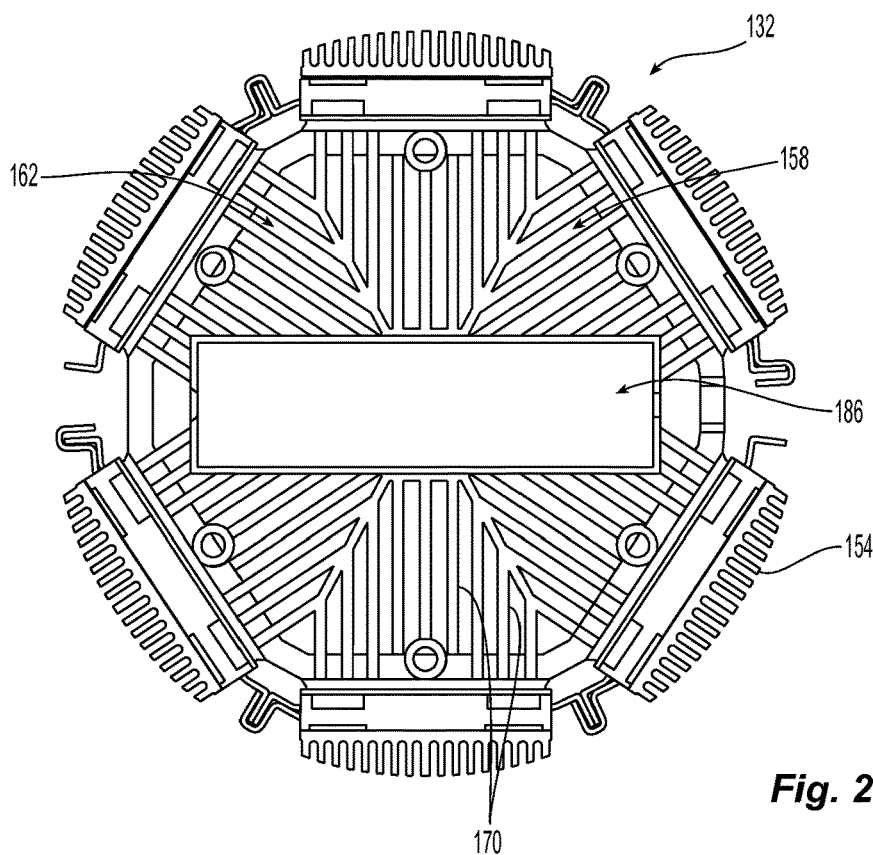
FIG. 24 is an axial rear view of the electronic package as shown in FIG. 17, showing bi-directional heat flow from the MOSFET modules, and indicating the positions of some power electronics devices within the modules.

Relative to the power module orientations in prior electric machines 100 (see, e.g., FIG. 2), the power modules 154 attached to the cooling tower 158 are turned on edge, which provides many design advantages. Referring to the exemplary embodiments of FIGS. 4-7 and 11-25, the electronic package 132 includes a metallic cooling tower 158 defined by an axially extending first wall 160 that extends between axially opposite first 162 and second 164 ends thereof and about the package central axis 168 such that, in an axial view (FIG. 20), the cooling tower 158 is shaped like an extruded polygon with finned surfaces or ribs 170 extending inwardly of the cooling tower from the radially inner surface 172 of the first wall 160. The cooling tower may, for example, be an aluminum casting or extrusion of which the first wall 160 and the ribs 170 are integrally formed members. In the exemplary embodiments, the package central axis 168 and the machine central axis 138 are coincident when the electronic package 132 is installed as a component of machine 130. The axially opposite first wall ends 162, 164 respectively define the first and second axially opposite ends 162, 164 of the cooling tower 158. An axially extending air passage 174 is defined by the radially inner surface 172 of the first wall 160.

On the radially outer surface 176 of the cooling tower structure 158, the power modules 154 are mounted on the flat polygon surfaces, which define mounting pads 178 for the power modules 154. The mounting pads 178 are evenly distributed circumferentially around the radially outer surface 176 of the cooling tower 158. For example, the mounting pads may be generally equiangularly distributed about radially outer surface 176. The cooling tower 158 defines a main heat sink 180 for the power modules 154, which are in conductive thermal communication with the mounting pads 178. The cooling tower ribs 170 extend inwardly directly away from these power module mounting surfaces 178. In the depicted embodiment, radially inward of the first wall 160 is a second wall 182. The first wall 160, the second wall 182 (included the depicted embodiment), and the ribs 170 are integrally formed members of the metallic cooling tower 158. The second wall 182 extends axially between opposite first and second axial ends 162, 164 of the cooling tower 158, and about the package central axis 168. In an axial view, the second wall 182 defines another hollowed polygon whose radially inner surface 184 defines a space, or well 186, that serves as the location for the control electronics 188. In the depicted embodiment, the well 186 is bottomless within the cooling tower 158, and has an axially projecting profile that may, for example, be polygonal though it is to be understood that in other embodiments, the well 186 structure can be of different shape or depth, or be omitted altogether.

The cooling tower 158 has a generous cross sectional area in planes perpendicular to the central axis 168 along the length of the electronic package 132. Where used with an air-cooled machine 130, axial air flow along the air passage 174 extending through the cooling tower 158 is uniform and near the radial center of the machine 130, which works well with the natural air flow pattern in machines of dual internal fan construction; optimal performance in such machines results from the cooling air entering the rear fan 148 axially through the inside diameter of the fan blades. Furthermore, the heat sink 180 has fins or ribs 170 traversing the air passage 174, between which cooling air flows. The ribs 170 extend radially inwardly from the angular locations of the power module 154 mounting locations, and also extend axially between the air passage inlet 190 and outlet 192, which are defined at the respective, axially opposite first 162 and second 164 ends of the cooling tower 158. The ribs 170 provide a large surface area from which heat is convectively transferred to the cooling air, which yields superior air cooling performance. The fins or ribs 170 of the heat sink 180 extend radially inwardly toward the central axis 168 of the cooling tower 158 from the mounting pad location of each respective power module 154. The ribs 170 of the cooling tower 158 are positioned directly in the high velocity air flow of cooling air entering the rear of the electronic package 132, and are arranged in concert with the natural flow path of air entering the air passage 174 through its inlet 190 near the first axial end 162 of the cooling tower 158.

A cooling tower 158 according to the present disclosure provides maximized spatial dispersion of the individual MOSFETs both angularly about the central axis 168 and in the axial direction. Maximizing spatial dispersion between the power electronics devices 154 tends to minimize their thermal conduction interaction and resulting device temperature.

The cooling tower 158 provides a large degree of dispersion of the individual power modules 154, which serves to minimize their thermal interaction and reduce their temperatures. This dispersion is a function of the cooling tower geometry, which in the exemplary embodiments circumferentially distributes six power modules 154 equally about the radially outer surface 176 of a cooling tower first wall 160 that extends between the axially opposite ends 162, 164 of the cooling tower and about the central axis of the electronic package. Ideally, heat loss sources, such as multiple MOSFET modules 154, are spread as far apart from each other as possible to minimize their conductive thermal interaction. In an electronic package 132 having a cooling tower 158 as disclosed herein, the individual MOSFETs are substantially equally spaced over a 360 degree arc about the central axis 168 of the machine 130. Further, the positive 194 and negative 196 MOSFETs within each power module 154 are widely separated in the machine's axial direction.

The depicted cooling tower embodiment provides a hollowed space or well 186 for control electronics packaging appropriately in the radial center of the main heat sink 180. This central location maximizes distances between the control electronics circuitry 188 and each power module 154. It also locates control electronics circuitry 188 in an optimal area for cooling, this area being furthest from the power module heat sources. Positioning the control electronics 188 at this location also maximizes available space utilization by locating the control electronics, which require relatively less cooling than do the power modules 154, directly behind the rear bearing of the electric machine 130. In some air-cooled machine embodiments, this area is in an air flow dead space, i.e., portion of an air passage through which no air flow would otherwise occur. In other words, air would not flow through this space regardless of the presence or not of the electronic control circuitry 188.

Thermal benefits also result from locating the control electronics 188 near the radial center of the electronic package 132 and axially rearward the power electronic device positions. Cooling air enters the cooling tower 158 in an axial direction from the rear axial end 162 of the electronic package, and is drawn forward through the air passage 174, towards the rear frame of the machine 130. Positioning the electronic control circuitry 188 at this location, the coldest possible air is available for cooling its components, which typically are lower temperature rated. Moreover, since the control electronics 188 produce relatively little heat relative to the power electronics or the machine's stator 142 and rotor 140, the control electronics do not increase the temperature of the cooling air in a meaningful way that is harmful to the downstream components.

Further, having the control electronics 188 in the center of the electronic package 132 maximizes the physical distance to its typically lower temperature rated components from the heat-producing MOSFETs, which are higher temperature rated. Since the waste heat from the MOSFETs is removed by the finned surface areas of the cooling tower 158, the heat sink surfaces around the control electronics 188 will be cooler than those near the MOSFETs, which is beneficial for the control electronics.

Centrally locating the control electronics 188 also minimizes the electrical signal transmission distance between the control electronics and power electronics 152, which beneficially minimizes electrical noise issues and cabling costs.

The radially outer surface 178 of the second wall 182 of the depicted embodiment is connected to the radially inner surface 184 of the second wall through the ribs 170, some of which define radial spokes extending inwardly from angular locations between circumferentially adjacent power module mounting sites. The first 160 and second 182 walls and the ribs 170 are integrally formed as an aluminum casting or extrusion, and are therefore in conductive thermal communication with each other. The axial air passage 174 is defined between the first and second walls, which is traversed by the ribs. The axial cross-sectional shape of the air passage 174 is generally annular between the opposite axial ends 162, 164 of the cooling tower 158.

The depicted cooling tower and power module layout works well with typical alternator construction. It allows the ambient cooling air to flow axially into the machine 130 near the central axis 138 with a very generous and angularly uniform inlet area, but at the same time provides a large surface area for mounting and conductive cooling of the MOSFET modules 134.

The cooling tower 158 beneficially facilitates a very uniform flow of cooling air into the rear of the electronic package 132. The typical electronics layout of prior air-cooled electric machines 100 is geometrically asymmetrical in an angular sense and has areas from which cooling air flow is completely blocked, as is apparent in the example of FIG. 2. Non-uniformity of the cooling air flow stream resulting from such air flow blockage can create hot spots on the stator 104 of the electric machine 100, which in turn lowers the temperature capability and/or performance of the machine. In comparison, the greater uniformity of the electronics layout in the electronic package 132 provides a relatively uniform air inlet area to the cooling tower 158, and a cooling air flow therethrough that is much more uniform, minimizing the possible occurrence of hot spots on the stator 142.

The mounting direction of the power modules 154 being perpendicular to the orientation of the rear frame member 134 greatly minimizes the area the modules axially project onto the back face 144 of the machine 130. Orienting the generally flat power modules 154 such that they are edge-wise to the back face 144 when mounted, or substantially parallel to the central axis 168, better allows packaging of a MOSFET module number and size required for a desired electric machine design, and much greater design flexibility, vis-à-vis the electronics layouts of prior electric machines.

By virtue of cooling tower ribs or fins 170 being in the cooling stream of incoming air flow and radially extending inwardly from locations directly inward of the power module mounting locations 178, minimal thermal conduction resistance exists between the power devices 154 and the cooling tower fins 170.

A cooling tower structure 158 according to the present disclosure allows cooling air to enter axially into the electronic package 132 with minimal restriction and a high degree of angular uniformity.

In electric machine embodiments 130 of dual internal fan construction, cooling air must enter the rear centrifugal fan 148 at its inner blade diameter for the fan to function properly, and a cooling tower structure 158 according to the present disclosure lends itself naturally to this type of flow. External fan machines 130, typical of current heavy duty alternators, also work well with this cooling tower structure, as the air can flow through the air passage 174 and into the rear of the machine 130 with little flow restriction.

The exemplary cooling tower geometry is also compatible with liquid-cooled applications. In such applications, the back face 144 of the electric machine 130 is liquid cooled and the cooling tower 158 is mounted directly on this liquid cooled surface. The cross sectional area of the cooling tower's integrally connected, thermally conductive members 170 allows the heat to flow conductively through the cooling tower 158 from the MOSFETs to the back face 144 surface, from which is can be convectively removed by the liquid coolant circulating through a water jacket 146 defined by the frame's back face member 144. In other words, the relative large cross sectional areas of the cooling tower wall 160 defining the outer wall surface 176, and ribs 170, provide a low conductive thermal resistance for transferring waste heat from the MOSFETs to the back face surface. In addition, natural convection additionally occurs from the rib surfaces of the heat sink, which further serves to remove the waste heat. Thus the cooling tower 158 is compatible with both air and liquid cooled electric machines 130.

Beneficially, the electronic package 132 is adapted for attachment to the rear frame member 134 of an electric machine 130 via the cooling tower 158, which is the main heat sink for the power modules 154. The base plates 200 of the power modules 154 and the module mounting locations 178 on the cooling tower 158 are directly in surface-to-surface contact, whereby they are in conductive communication electrically and thermally. Because the module base plates 200 and the cooling tower 158 are electrically at ground potential, the cooling tower can be attached directly to the rear frame of the machine.

This is characteristic of the electronic package 132 is important for liquid-cooled applications, wherein the generous cross section of the heat sink 180 in planes perpendicular to the central axis 138 of the machine 130 facilitates the heat, transferred from the power devices 154 to the cooling tower 158 through their contacting mounting surfaces along a primary cooling path 202, to be further conducted along the primary cooling path 202 to the back face 144 of the electric machine 130. The back face 144 is formed on a rear frame member 134 and defines the rearwardly facing surface of the machine housing. In liquid cooling electric machines 130, the back face frame member 134 typically defines a liquid coolant passage 146. Heat is transferred convectively from the back face frame member 134 to the liquid coolant flowing through the water jacket 146. Heat conducted from the cooling tower 158 to the back face 144 is removed by convection to the cooling liquid that is circulated across the back face member 134 of the frame.

Yet another machine topology that can utilize electronics packaging according to the present disclosure is an air-cooled electric machine 130 that has axially directed air flow substantially along the inside surface of the machine's outer frame diameter. In an embodiment of such a machine according to the present disclosure, both the liquid-cooled and air-cooled modes of cooling are employed. First, some of the heat from the MOSFETs is removed from the extensive surfaces of the cooling tower heat sink ribs 170 through convection to an axial flow of cooling air, as in an embodiment of a machine having dual internal fans. However, since the air must bend internally of the machine, at a point downstream of the cooling tower 158 and rear frame member 134 interconnection location, a pressure drop is introduced to the cooling air that lessens its flow and therefore its cooling capabilities. However, just as with liquid-cooled applications, the generous area of the heat sink 180 in axial cross sections all along the central axis 168, allows the remaining portion of the heat transferred to the cooling tower heat sink 180 from the MOSFETs along the primary cooling path 202 to be conducted further along the path through the cooling tower 158, and into the rear frame member 134 of the electric machine 130, which can have additional surface finning to promote convective heat transfer to the cooling air, and/or openings to allow establishment of a parallel air flow path, so that sufficient cooling air enters into the machine for cooling of the machine's stator and rotor.

A cooling tower 158 according to the present disclosure offers a high amount of surface area for a given package size at the center of the structure that works in harmony with the natural cooling air flow stream direction in air-cooled machines.

The geometrical design and layout of a cooling tower according to the present disclosure provides an electronic package 132 compatible with air-cooled and/or liquid-cooled machines 130.

The cooling tower 158 provides a very rigid and stiff support structure for the electronics to be mounted on. The cooling tower's stiffness is beneficial for engine-mounted electric machine applications, where vibration is a significant concern. The rear frame members 110 of prior electric machines 100 are typically subjected to various modes of bending and distortion when in use on an engine due to engine vibration. Axial oscillation of the rotor assembly mass, and forces on the shaft induced by dynamic belt loading on the drive pulley, exert gyrating forces on the rear bearing, thereby inducing dynamic forces on the machine's rear frame member 110, which supports the rear bearing. In prior electric machines 100, these bending modes create movement of the electronic components 114 relative to each other and can cause component fatigue failures, especially of connecting straps and the like.

In an electronic package 132 according to the present disclosure, all of the electronics are mechanically tied directly to the cooling tower structure 158 and are not subject to the bending modes of the rear frame member 134. The integrally finned structure of the cooling tower 158, though primarily for cooling purposes, also intentionally serves to provide mechanical stiffness to the cooling tower structure. The axial length of the cooling tower, its 360 degree profile about its central axis 168, and its integral ribs 170 combine to provide an electronic package 132 according to the present disclosure relatively superior structural stiffness. Consequently, movement of the electronic components mounted to the cooling tower relative to each other is minimized, and the comparative vibration robustness of an electronic package as disclosed herein is greatly improved relative to the integrated electronics assemblies used in prior electric machines. Moreover, the rear frame member 134 of an electric machine 130 is advantageously stiffened by the attachment of the cooling tower 158 thereto. The stiffening of the rear frame member 134 minimizes its bending and distortion, which can in turn minimize other fatigue-related failures in the machine, such as throughbolt failure due to bending fatigue.

The highly rigid structure of the cooling tower 158 results from its having an profile extending 360 degrees about the central axis, and interlacing fins 170 that act as stiffening beams.

The cooling tower 158 is structurally rigid and minimizes vibration concerns since all power MOSFETs are mounted directly to it. Moreover, the rear frame member 134 of the electric machine 130 is also desirably stiffened by the electronic package 132 being mounted to the frame member 134 through the rigid cooling tower 158.

The control electronics 188 are tucked into the body of the main cooling tower heat sink 180, which minimizes the axial space required by the overall electronic package 132. The central mounting location of the control electronics assembly minimizes air flow blockage, minimizes exposure of the control circuitry to heat losses from the power electronics, exposes the control electronics to the coolest cooling air entering the electric machine 130, and minimizes the electrical signal transmission distance between the control electronics 188 and the power electronics 152, which minimizes electrical noise problems and cabling costs.

Figure 25:
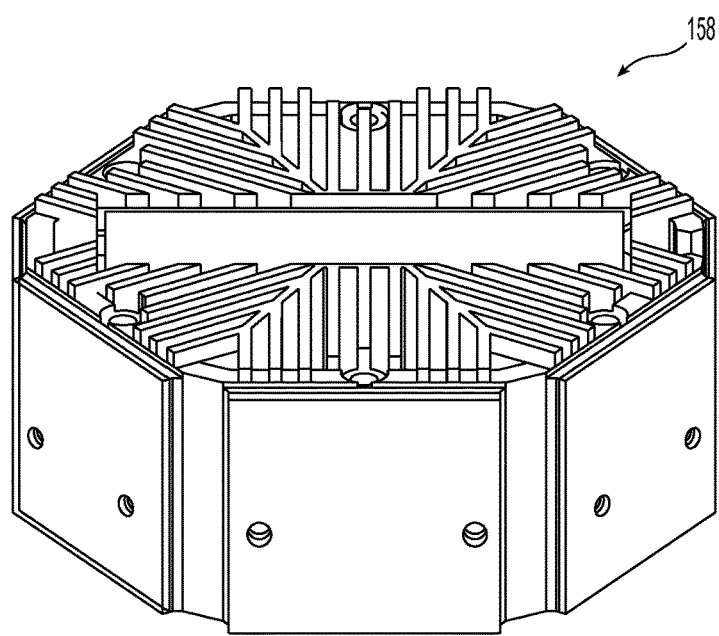
FIG. 25 is a rear perspective view of the cooling tower of FIG. 18.

In an exemplary embodiment of the electronic package 132 the MOSFETs 194, 196 and the MOSFET driver 204 contained in each power module 154 are in conductive thermal communication with the cooling tower heat sink 180, about which the modules are circumferentially distributed. Conductive heat transfer to this main heat sink is the primary cooling path 202 for each MOSFET module 154. Beneficially, the positive (or high side) 194 and negative (or low side) 196 power devices (MOSFETs) of each power module 154 beneficially share a common module heat sink. This desirable feature results from both the positive and negative MOSFETs 194, 196 being identical N-channel devices with the same polarity and, in the exemplary embodiment depicted, providing a thin layer 206 of thermally conductive electrical insulation that extends over the entire interior surface 208 of the metallic module base 200, as shown in FIG. 25. The thin electrical insulation layer 200 has low thermal resistance, and may be an existing, commercially available material such as, for example, Thermal Clad™, commonly referred to as "T-Clad", a product of Henkel Corporation (www.henkel.com) and formerly from The Bergquist Company of Chanhassen, Minn., USA.

Figure 26:
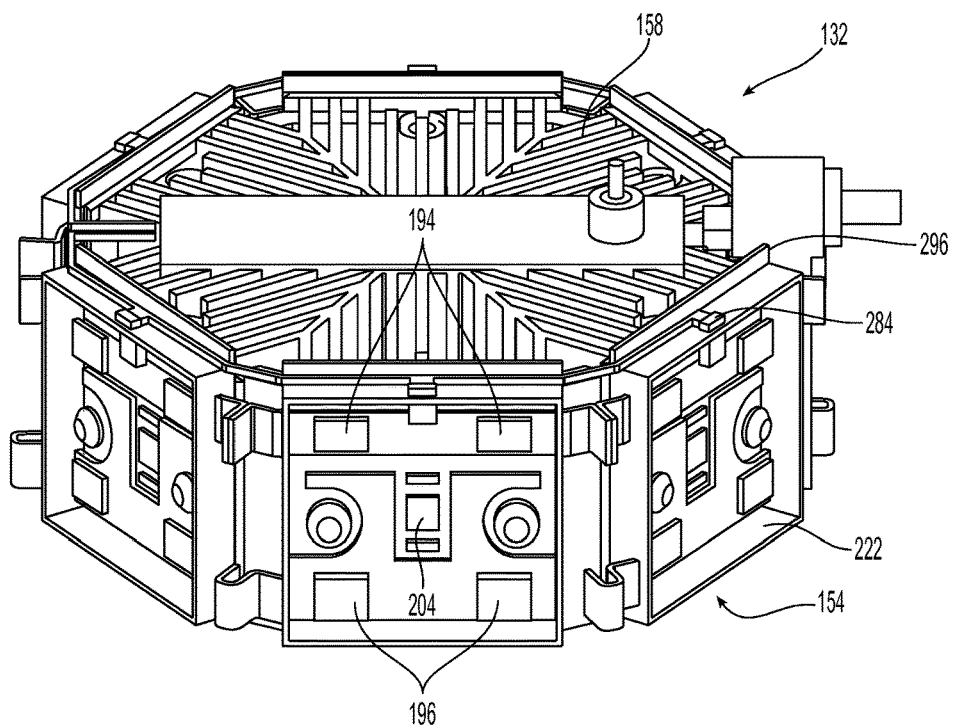
FIG. 26 is a rear perspective view of electronic package of FIG. 13, with the covers of the power electronics module housings removed.
Figure 27:
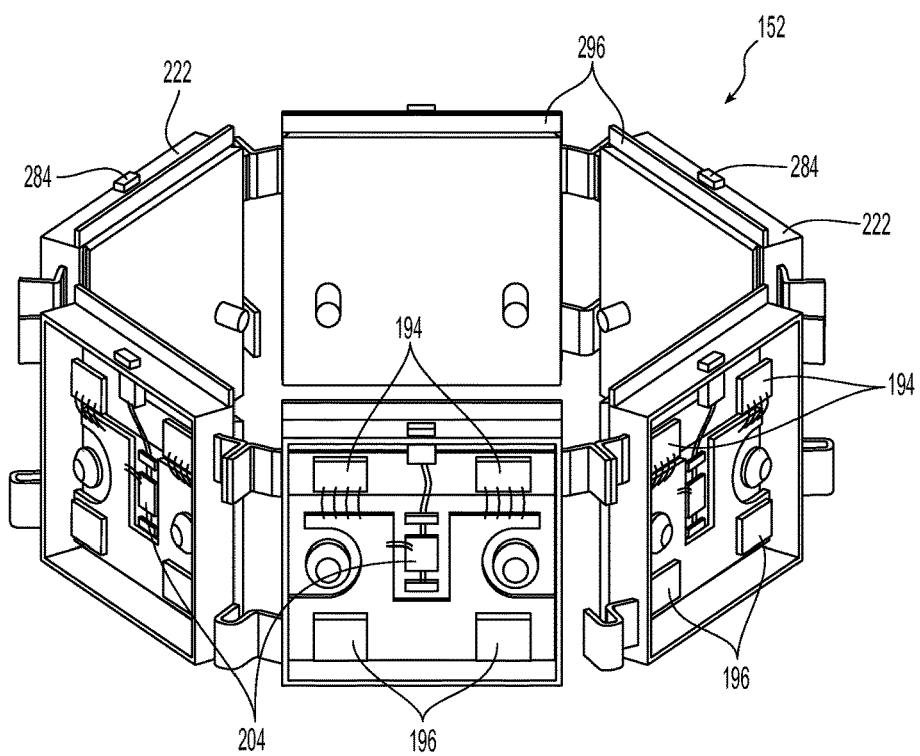
FIG. 27 is a rear perspective view of the interconnected MOSFET modules of FIG. 19 without their covers.
Figure 28:
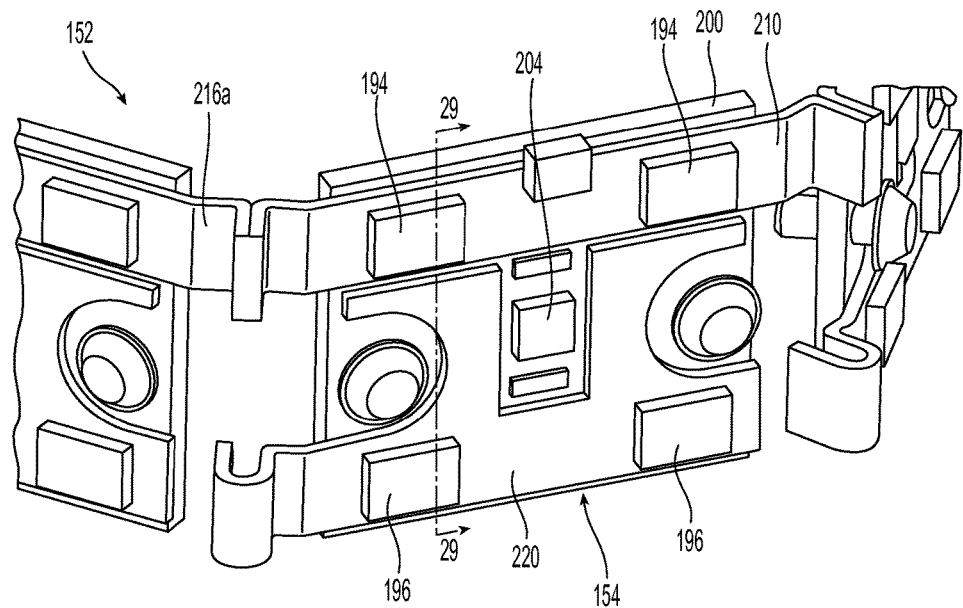
FIG. 28 is a fragmented, partial rear perspective view of the interconnected MOSFET modules of FIG. 27, showing their power electronics devices and electrically insulative (T-Clad) base layers.
Figure 32:
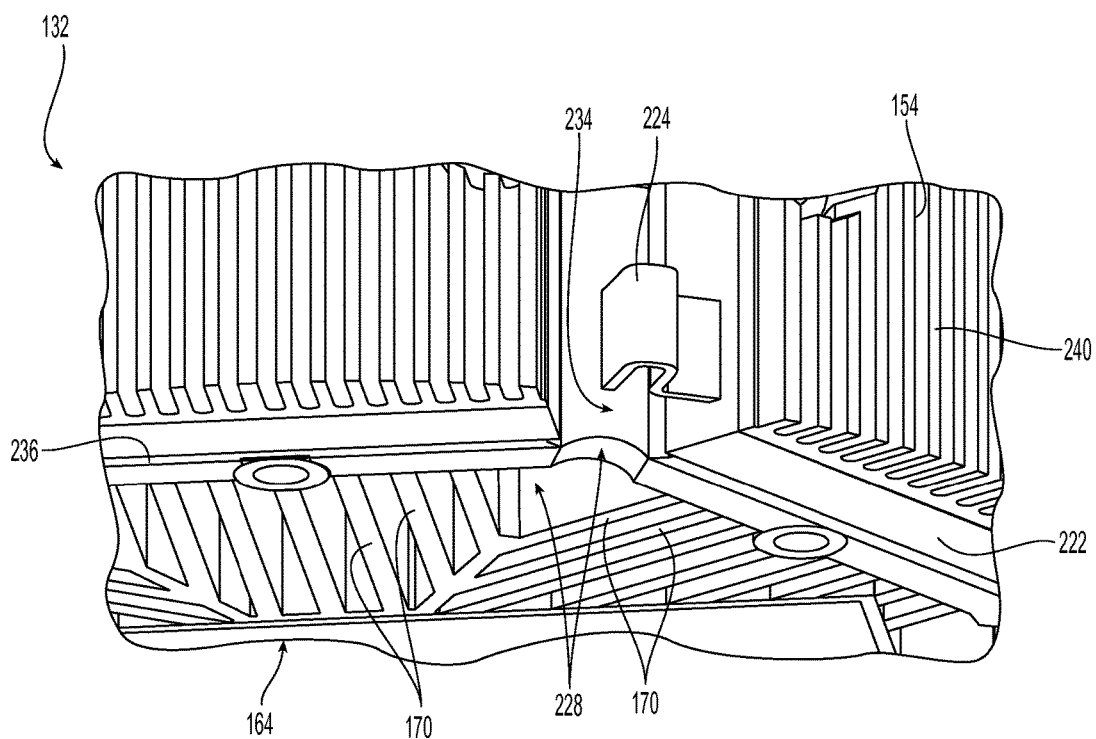
FIG. 32 is a fragmented front perspective view of a portion of an electronic package embodiment according to the present disclosure, showing a recess or slot in the cooling tower between a circumferentially adjacent pair of MOSFET modules, through which a phase lead wire exiting a hole in a small diameter rear frame member (not shown) may be routed to its respective MOSFET module phase terminal.

In one embodiment, the insulation layer 206 is printed on a surface 208 of the module's heat-sunk metallic base 200. Atop this insulation layer 206 is printed a copper trace or strip (not shown). Referring to FIG. 26, a much thicker strap 210 of copper suitable for the current levels conducted through the power modules 154 is soldered to the printed copper strip, and the positive MOSFETs 194 are attached directly to the copper strap 210. Within each module 154 the drains of the positive MOSFETs are connected to the copper strap 210.

As noted above, the exemplary electronic package 132 utilized two parallel-connected sets 156a, 156b of three MOSFET power modules 154. Amongst the three, circumferentially adjacent modules 154 of the first set 156a, which are respectively in communication with an associated conductor 212a of the stator's first winding set 214a, the copper straps 210 are interconnected to form a daisy-chained first power bus 216a. Likewise, amongst the three, circumferentially adjacent modules 154 of the second set 156b, which are respectively in communication with an associated conductor 212b of the stator's second winding set 214b, which is shifted 30° relative to the first winding set 214a, the copper straps 210 are interconnected to form a daisy-chained second power bus 216b. The first and second power buses 216a, 216b are interconnected at the machine's B+ terminal 218, which is a component of the electronic package 132.

Similarly, another, parallel copper trace or strip (not shown) is printed atop the insulation layer 206. Referring again to FIG. 26, a much thicker copper member 220 suitable for the current levels conducted through the power modules 154 is soldered to this printed copper strip, and the negative MOSFETs 196 are attached directly to the copper member 220. Within each module 154, the drains of the negative MOSFETs 196 and the sources of the positive MOSFETs 194 are electrically connected to the copper member 220. The copper member 220 of each power module 154 extends from its module housing 222 to define the respective module's phase connection terminal 224, to which the respective stator winding 212b associated with that power module 154 is connected via a phase lead wire.

The source of each negative MOSFET 196 is electrically connected to its module's metallic base 200, and is grounded through the base and the respective mounting pad 178 of the cooling tower 158 to which the module base is attached. The MOSFET driver 204 of each power module 154 is mounted directly to the electrically insulative layer 206, and is in communication with the control circuitry 188 via a respective signal lead 226.

As mentioned above, its ability to share a common main heat sink 180 at ground potential for the positive 194 and negative 196 MOSFETS of its plurality of power modules 154, rather than requiring separate positive and negative heat sinks at different potential levels as is typically done for the power electronics devices 116 of prior electric machines 100, provides the inventive electronic package 132 substantially greater design flexibility, vis-à-vis prior integrated electronic packages 114, to accommodate convection for air cooling, and/or conduction for liquid cooling via the back face 144 of an electric machine's rear frame.

Typically, the power electronics side of the phase connection to stator winding phase conductor 212a, 212b is in a fixed, rigid position. A typically-sized automotive alternator has a generally circular frame outside diameter of 140 mm. With reference to FIG. 2, the power module phase terminal connectors 120 in a prior electric machine 100 are radially located such that it can accommodate a narrow range of machine sizes, such as 129 to 144 mm stator outside diameter.

A slot or recess (hereinafter "void") 228 provides clearance for packaging the respective phase lead wire 230 defined by a phase conductor 212a, 212b of the stator winding that extends between the stator 142 and the associated power module phase terminal connector 224. Providing these voids 228 in the rear frame back face 144 and/or the electronic package's cooling tower 158 allows identical electronic package embodiments 132 to accommodate relatively larger variations in the radial position of the stator phase conductors 212a, 212b. Thus, a single electronic package 132 size may be utilized in electric machines 130 of various stator sizes, including sizes so small as to radially position the location 232 of stator phase conductor egress from the back face 144 inside the perimeter of the cooling tower axial end 164 attached to the back face 144, though the module phase terminal connector 224 locations are outside of that perimeter.

Prior electric machines 100, which have electronic package layouts in which MOSFET modules 116 are mounted to back face 112, with the module base mounting surfaces disposed in a plane perpendicular to the central axis 108, as shown in FIG. 2, cannot feasibly provide such voids near the module phase lead connector terminals 120, because the voids would be at the modules 116 themselves. It is desirable to accommodate a broader range of machine sizes, however. For instance, the design requirement desired for an embodiment of an electronic package 132 according to the present disclosure calls for accommodating a range of stator machine diameters ranging from 120 mm up to 190 mm.

However, the MOSFET modules 154 being mounted to the cooling tower 158 at circumferentially distributed locations about the central axis 138, and in planes parallel with the central axis, provides a recess 228 between circumferentially adjacent power modules 154. The cooling tower ribs or fins 170 in this area can be removed without a large detrimental thermal issue since the location lies in a naturally occurring adiabatic plane.

Via axial location of the MOSFET module 154 afforded by the cooling tower 158, there is some axial space 234 between the phase lead connection 224 and the back frame 144 of the electric machine 130. This yields valuable length between the stator end turns and the phase connection at the phase terminals 224 of the MOSFET module 154 for the stator conductor 230 to be routed and radially transition between the two locations relative to the machine shaft's axis of rotation 138.

An electric machine embodiment 130 according to the present disclosure provides a slot opening or recess 228 in either or both of the cooling tower heat sink 180 and the rear frame 134, 144 of the electric machine 130, in the area between circumferentially adjacent power modules 154.

Certain exemplary electric machine embodiments 130 are provided with a plurality recesses or slots ("voids") 228 circumferentially distributed along the corner 236 formed between the cooling tower's forward axial end 164, which interfaces and is attachable to the machine's rear frame member 134, 144, and radially outer surface 176. Each void 228 is elongate in a radial direction and defines a recess opening axially forward, in the axial end surface 164 of the cooling tower 158, and radially outward at locations between circumferentially adjacent power modules 154, which are attached to mounting locations 178 on the cooling tower's radially outer surface 176. Each void 228 extends radially inwardly from the radially outer wall surface 176 to radial positions along the length of the void 228 that coincide with the phase conductor pass through locations 232 for machines 130 of various small sizes.

Figure 30:
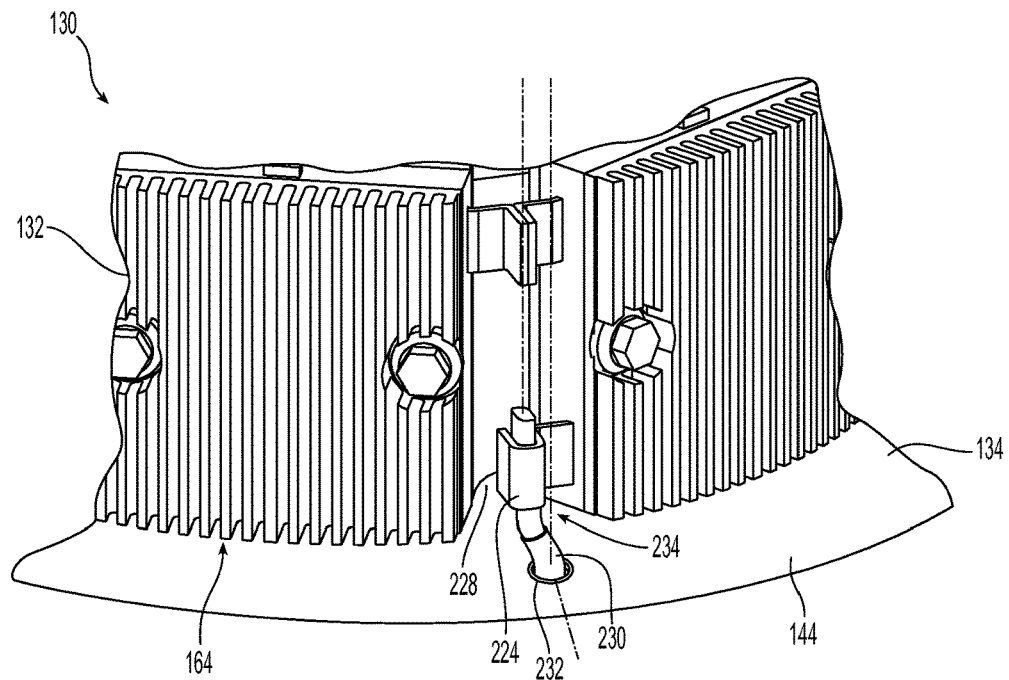
FIG. 30 is a fragmented, rear perspective view showing an electric machine according to the present disclosure having an electronic package and a rear frame member of large diameter, with a phase lead wire exiting the frame member at a location radially outward of its connection point to its respective MOSFET module phase terminal.

Referring to FIG. 30, some electric machine embodiments 130 including such an electronic package 132 are of sufficiently large diametric size that their stator winding phase conductors 230 extend through the rear frame member 134 at locations 232 radially proximate or outward of the module phase terminal connectors 224. In such machines the phase conductors 230 are directed radially inward from their respective apertures 228 to be connected to the associated module phase terminal 224.

Figure 31:
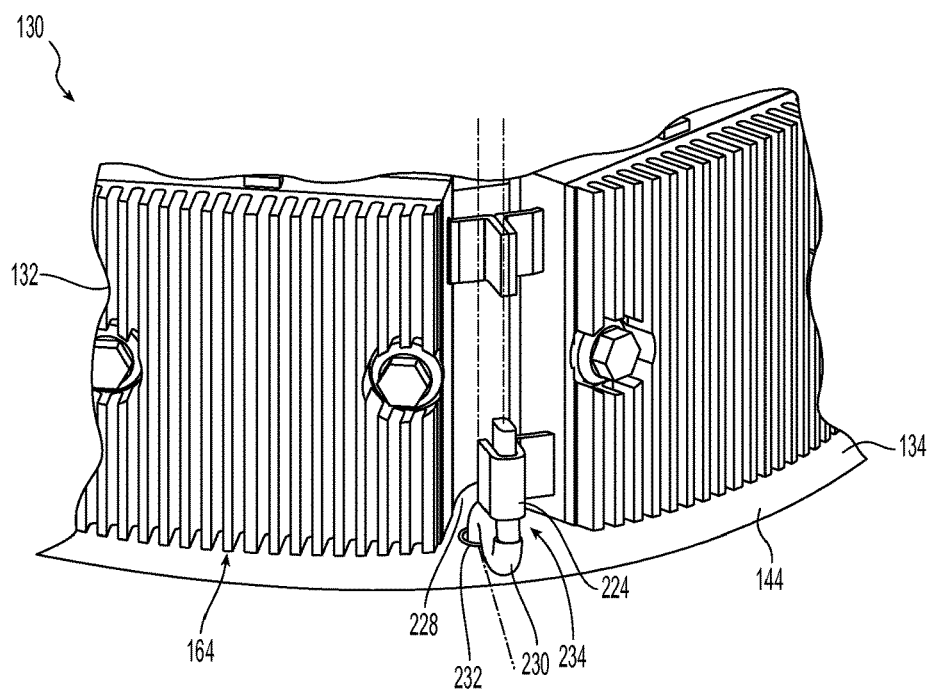
FIG. 31 is a fragmented, rear perspective view showing an electric machine according to the present disclosure having, relative to the electric machine of FIG. 30, an identical electronic package and a rear frame member of relatively small diameter, with a phase lead wire exiting the frame member at a location radially inward of its connection point to its respective MOSFET module phase terminal.
Figure 33:
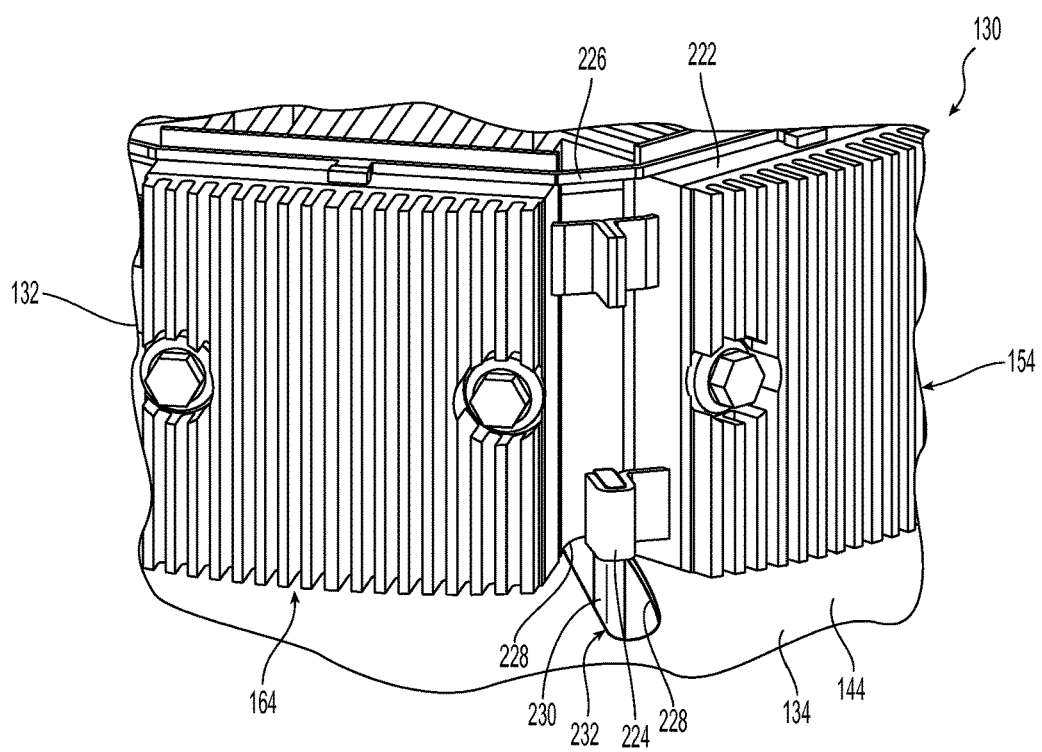
FIG. 33 is a fragmented, rear perspective view showing an electric machine according to the present disclosure having an electronic package and a rear frame member whose back face is provided with a void by which the radial position at which the phase lead wire exits the frame member may be adapted to that of the MOSFET module phase terminal.
Figure 34:
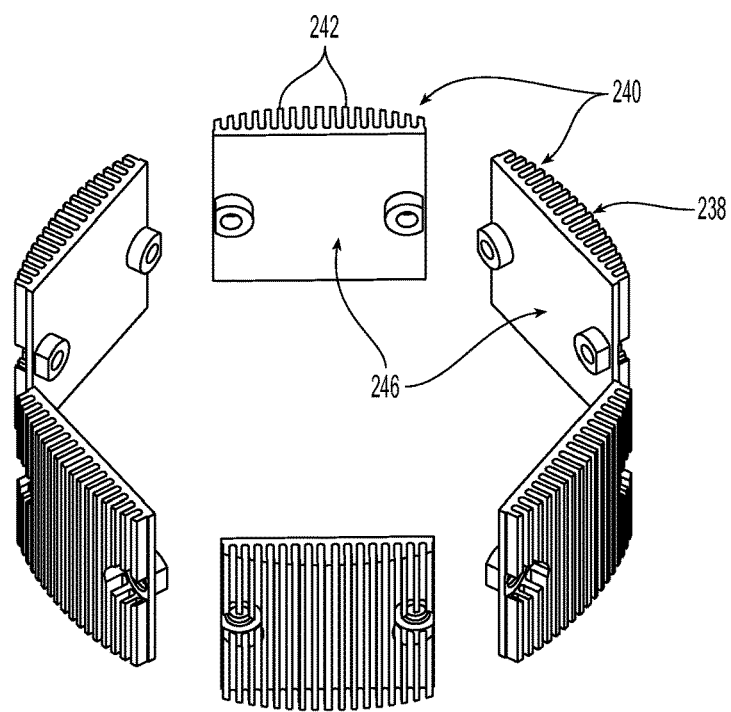
FIG. 34 is a view of the MOSFET module housing covers omitted from FIG. 27, arranged in their installed positions, showing the respective, integral bosses extending radially inward from the interior surfaces of the cover.
Figure 37:
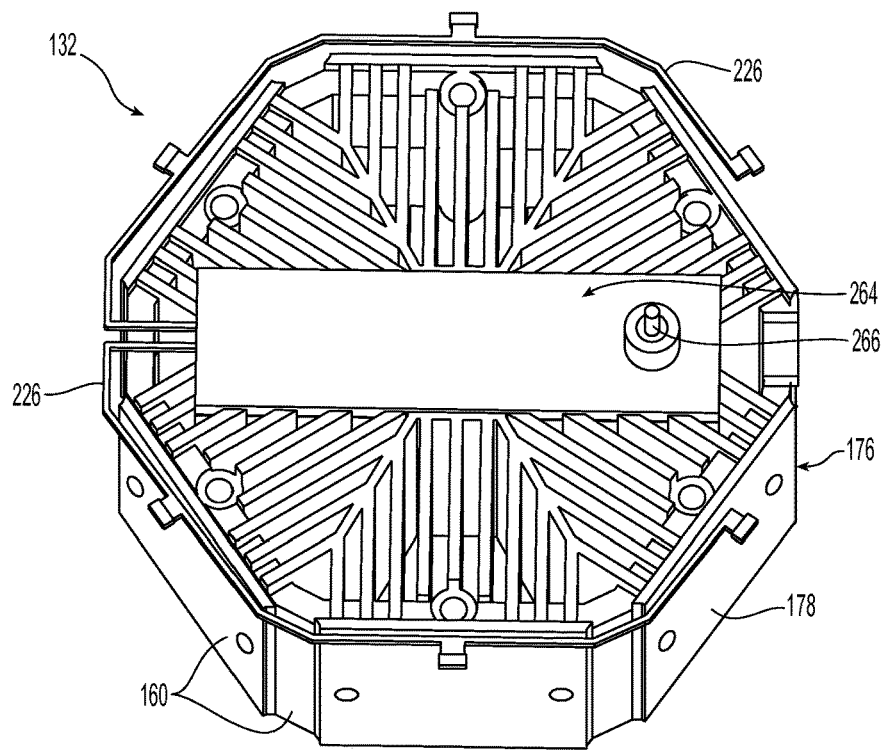
FIG. 37 is a rear perspective view of the main heat sink of the cooling tower, the control electronics assembly with circuits boards shown but lid or cover plate omitted, and the control electronics signal leads, of an electronic package embodiment according to the present disclosure.
Figure 38:
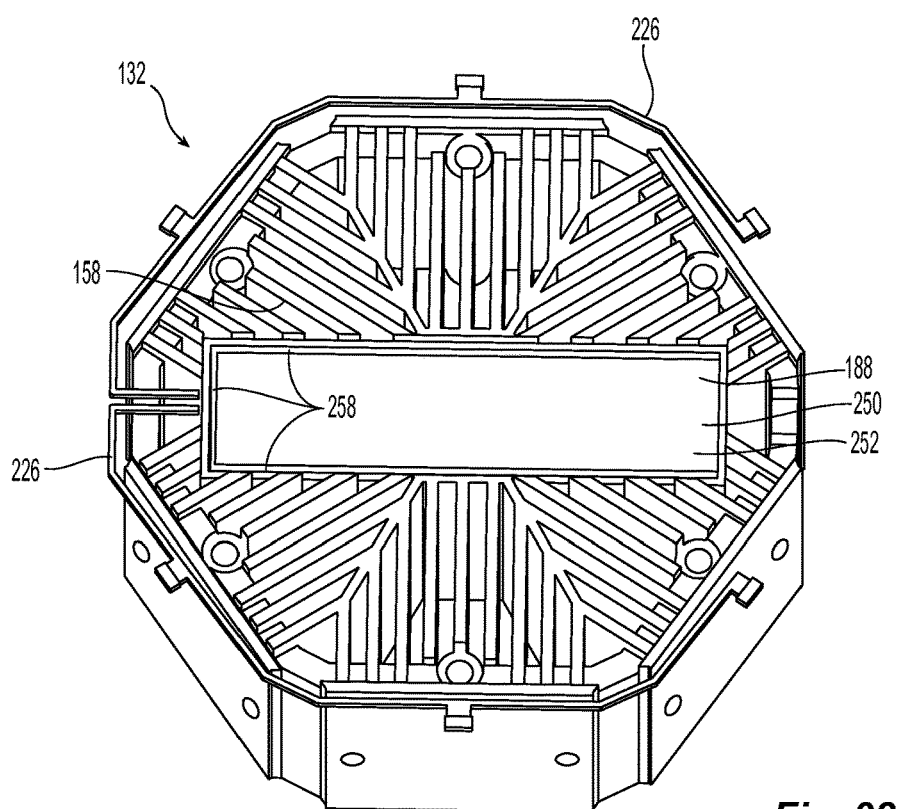
FIG. 38 is a rear perspective view similar to that of FIG. 37, but with the control electronics assembly removed.
Figure 39:
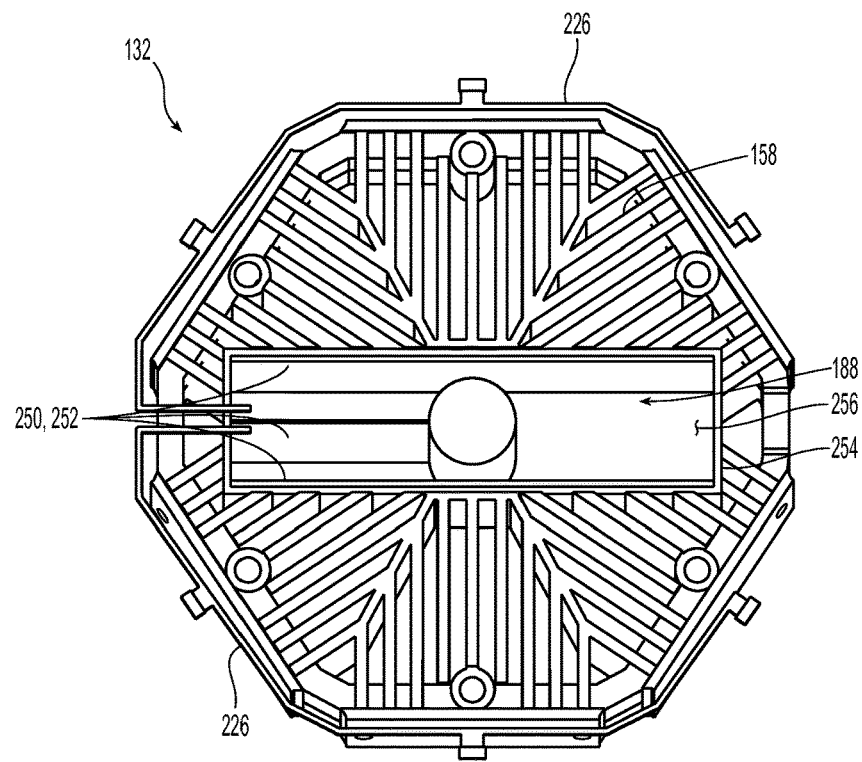
FIG. 39 is a rear perspective view similar to that of FIG. 37, but with the lid or cover plate of the control electronics assembly, and the circuit board portion located on the interior face thereof, omitted, showing the interior of the plastic cup or receptacle and control electronics circuit board portions mounted therein.
Figure 40:
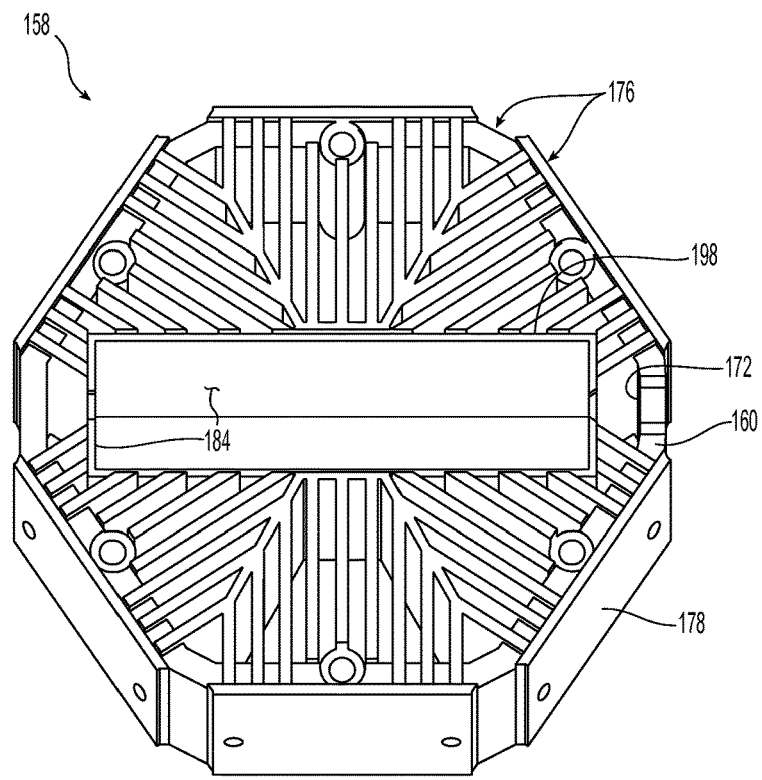
FIG. 40 is a rear perspective view similar to FIG. 18, showing only the main heat sink and the centrally located well thereof in which the plastic cup or receptacle of the control electronics assembly is normally contained.
Figure 41:
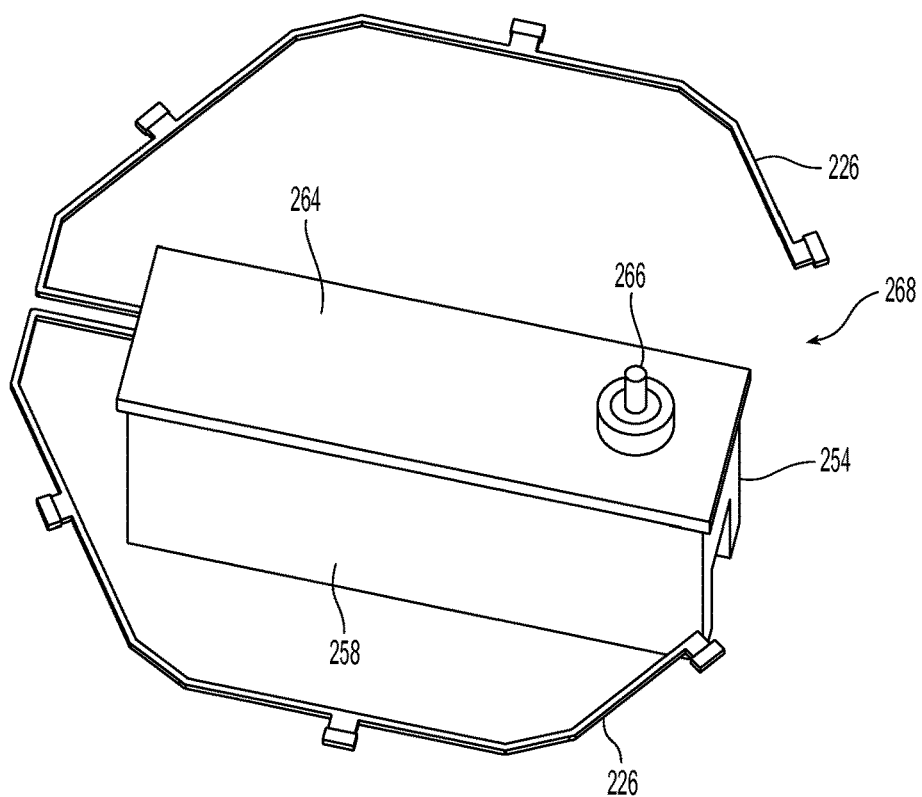
FIG. 41 is a rear perspective view of the control electronics assembly and the signal leads of an electronic package embodiment according to the present disclosure.
Figure 42:
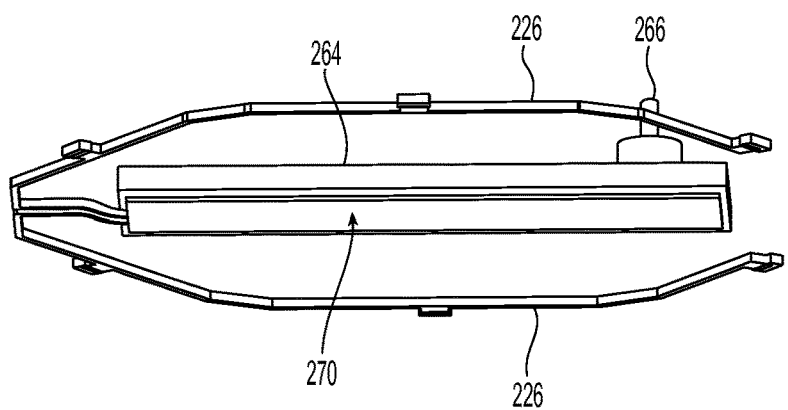
FIG. 42 is a front perspective view of the signal leads and the lid or cover plate and of the control electronics assembly shown in FIG. 41, showing the control electronics circuit board portion disposed on the interior surface of the lid.
Figure 43:
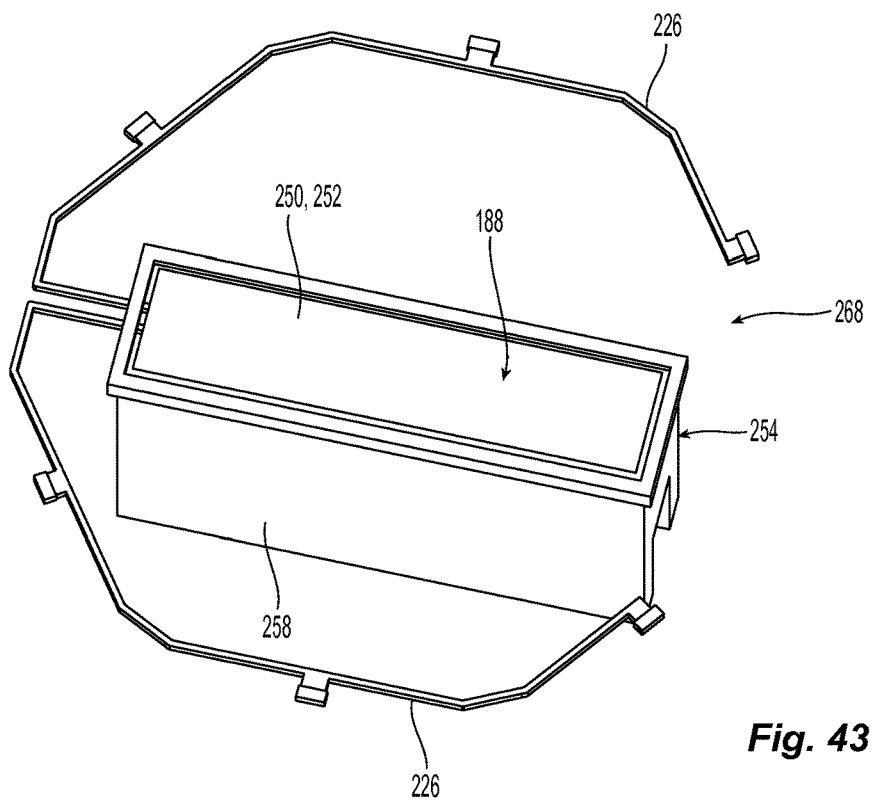
FIG. 43 is a rear perspective view of the control electronics assembly and signal leads shown in FIG. 41, with the lid or cover plate of the plastic cup removed, showing the circuit board portion normally disposed on the interior surface of the lid.
Figure 44:
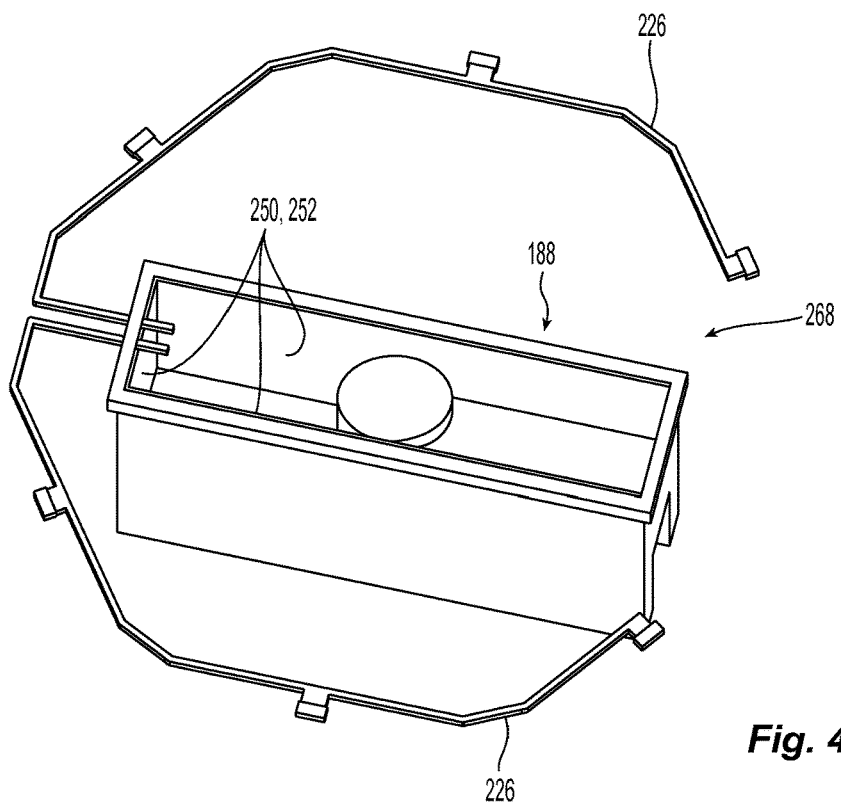
FIG. 44 is a rear perspective view of the control electronics assembly and signal leads as shown in FIG. 43, but with the circuit board portion normally disposed on the interior surface of the lid or cover plate omitted, showing the interior of the plastic cup and control electronics circuit board portions mounted therein.
Figure 45:
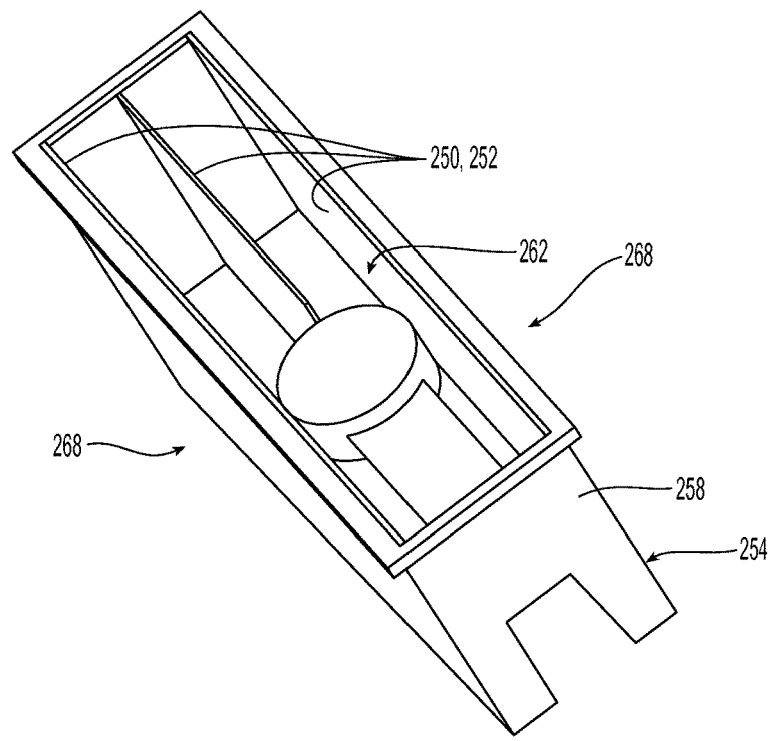
FIG. 45 is a rear perspective view of a portion of a control electronics assembly embodiment as shown in FIG. 39.
Figure 46:
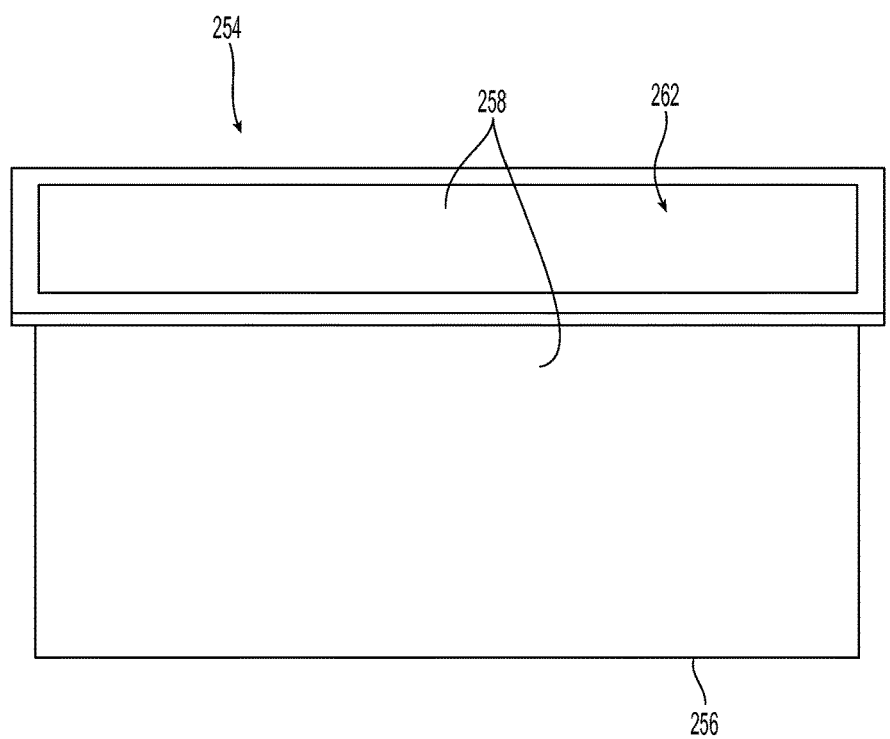
FIG. 46 is a side perspective view of the control electronics assembly portion of FIG. 45, with its circuit board portions omitted, showing only its plastic cup.
Figure 47:
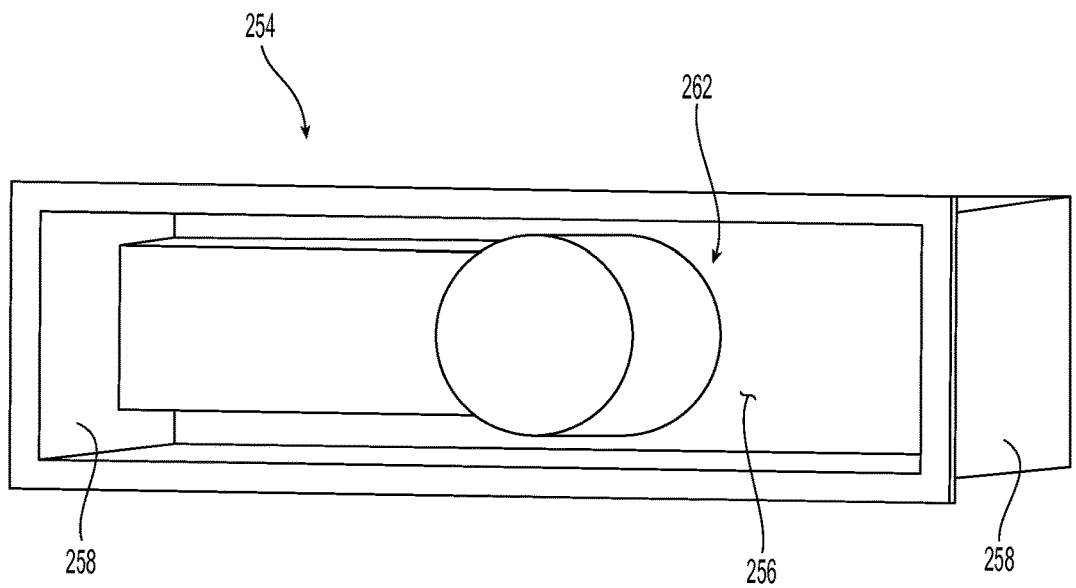
FIG. 47 is a rear perspective view of the plastic cup of FIG. 45, showing the cup interior.
Figure 48:
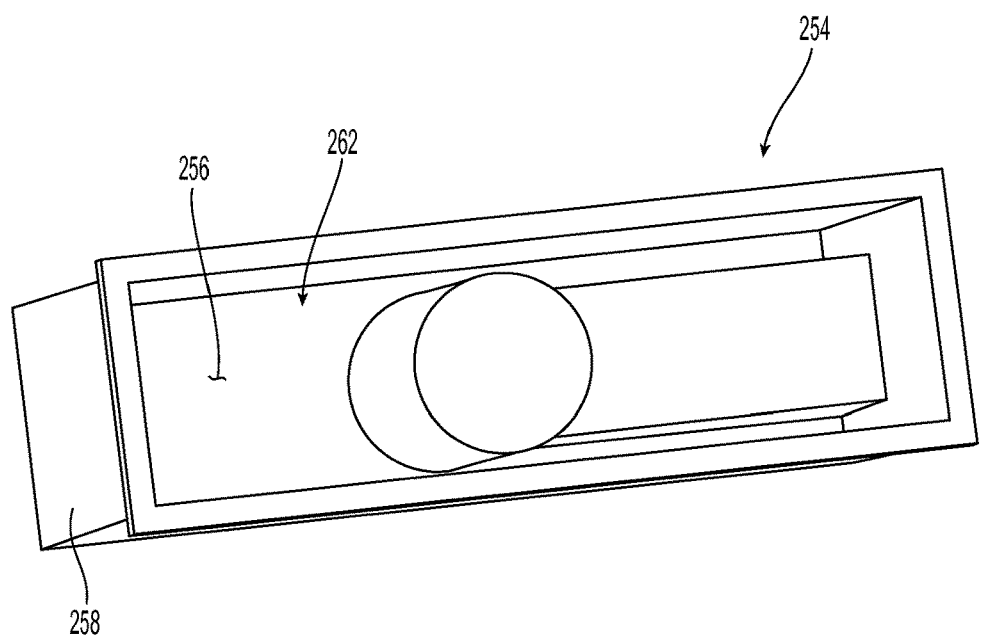
FIG. 48 is another rear perspective view of the plastic cup of FIG. 45, showing the cup interior.
Figure 49:
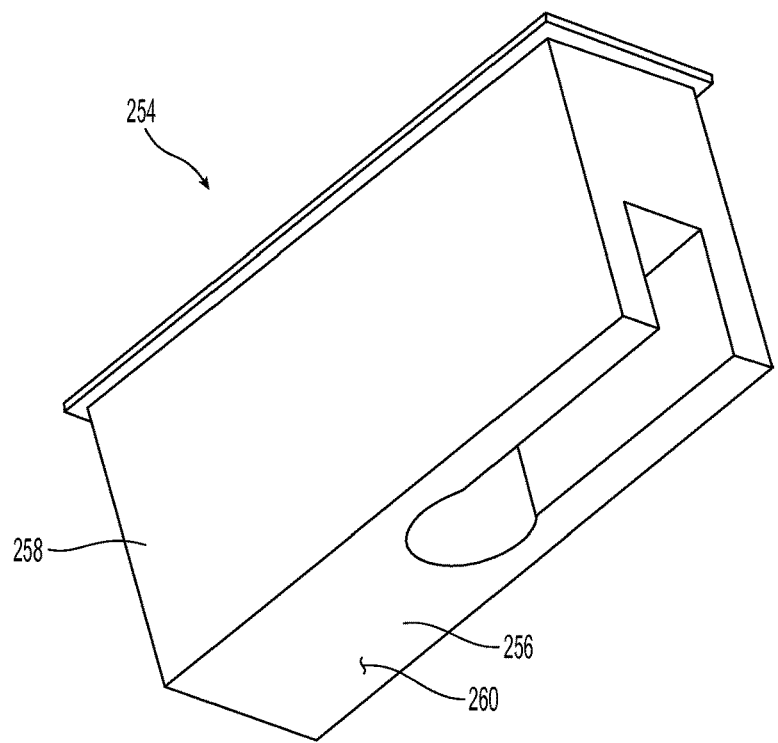
FIG. 49 is a front perspective view of the plastic cup of FIG. 45, showing the recess in which are normally disposed the electric machine shaft end and brush holder.
Figure 50:
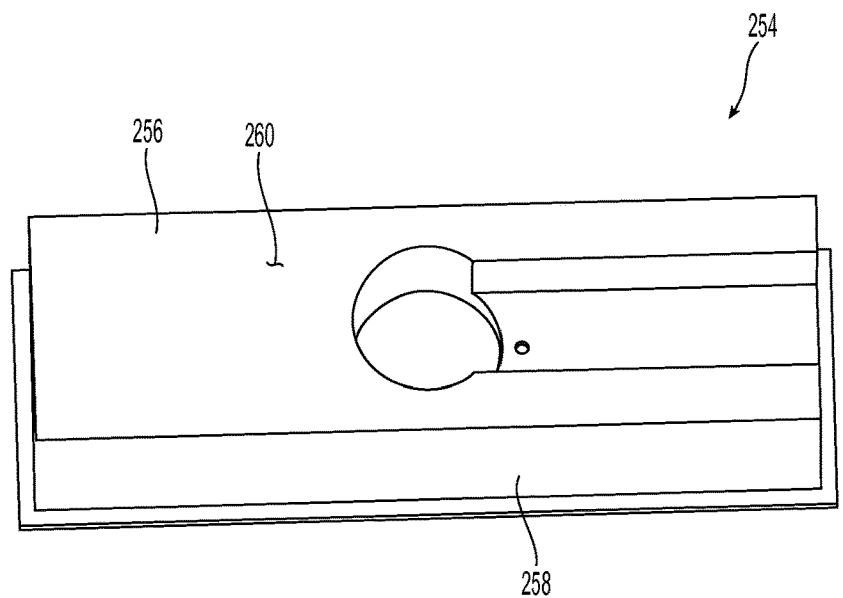
FIG. 50 is another front perspective view of the plastic cup of FIG. 45.
Figure 51:
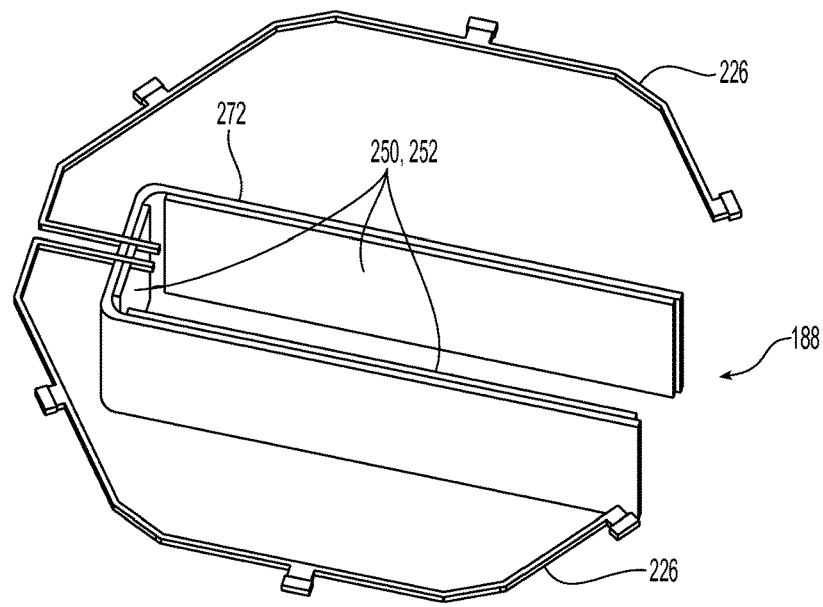
FIG. 51 is a rear perspective view of the circuit board portions and signal leads shown in FIG. 44.

Referring to FIG. 31, other electric machine embodiments 130 include an identical electronic package 132 and are of relatively smaller diametric size. The phase conductors 230 extend through the rear frame member 134 at locations radially inward of the module phase terminal connectors 224, and perhaps at radial positions inside the void 228. In such machines the phase conductors 230 are directed radially outward from their respective apertures 232, along the void 228. The void 228 is sized for routing the phase conductor 230 to the power module phase terminal 224, with clearance to the cooling tower 158 and the back face 144 to facilitate connection to the associated module phase terminal 224. In such machines, wherein the forward axial end 164 of the cooling tower superposes the phase lead wire egress location 232, the winding phase conductor (or phase lead wire) 230 can be routed radially along the void 228 with sufficient clearance to avoid wire damage and provide proper seating of the cooling tower 158 to the rear frame member 134.

In other embodiments, the electronic package 132 may or may not include voids 228, but the back face 144 is provided with an aperture 228 elongated in the radial direction through which the phase conductor 230 can exit the back face at positions 232 affording sufficient clearance to the cooling tower forward axial end 164.

With ample space 234 for a simple phase lead terminal structure 224 having a wrap-around strap coming from the MOSFET module 154, phase lead wires 230 of varying cross section can be accommodated. The connection is completed by soldering or welding the connection.

A one-piece molded plastic guide (not shown) provides the necessary electrical isolation between the stator winding phase conductor/phase lead wire 230, and the frame 134, 144 and the metallic cooling tower 158. This guide/insulator is simply trapped between the cooling tower and rear frame during assembly to hold the insulator(s) in position.

The exterior surface 238 of each power module cover plate 240 faces radially outward and is unobstructedly exposed to ambient air surrounding the electronic package 132. This facilitates convective transfer of heat generated by the power electronics devices 154 to the air surrounding the electronic package through the cover plate 240. The cover plate exterior surface 238 is configured, e.g., with fins 242, to enhance convective heat transfer therefrom to the ambient air. An electronic package embodiment 132 according to the present disclosure is thus provided with bi-directional cooling of each power module 154 in opposite radial directions.

The MOSFET modules 154 are mounted to the cooling tower structure 158 such that bi-directional cooling of the power electronics can be maximized. Heat loss from each power module 154 initially follows a primary cooling path 202 radially inward through the module base 200 and into the main heat sink 180 defined by the cooling tower 158 at the module mounting location, from which the respective cooling fins 170 extend radially inwardly. Heat loss from each power module 154 also initially follows a respective secondary cooling path 244 radially outward through its cast aluminum cover plate 240, and to the ambient air through the cover plate's finned exterior surface 238. The bi-directional cooling paths 202, 244 from the power electronics devices 194, 196, 204 of each module 154 minimize the thermal resistance to heat flow from the power electronics devices housed therein. Heat loss from the plurality of power modules 154 collectively also follows radially inward and radially outward primary 202 and secondary 244 cooling paths, relative to the electronic package 132. The primary and secondary cooling paths are parallel paths, rather than sequential paths.

The radially inwardly facing interior surface 246 of each module cover plate 240, which is exposed to the MOSFETs 194, 196 and the MOSFET driver 204 within the module 154, is provided with integrally cast bosses 248 that extend radially inwardly toward the MOSFETs and the MOSFET driver. Relative to each power module 154, the cast aluminum module cover 240 and its integral bosses 248 define a heat sink for heat loss from the power electronics devices, and the secondary cooling path. From an electrical standpoint, the cast aluminum cover 240 cannot touch these electronic components or their wire bonds, and so the boss 248 surfaces are spaced therefrom. Disposing the boss surfaces as close as possible to the MOSFETs 194, 196 and the MOSFET driver 204 while maintaining gaps therebetween, however, enhances the overall cooling of the power modules 154. Heat transfer to the boss surfaces could potentially be enhanced by further minimizing the gap between the bosses 248 and the MOSFETs 194, 196 and/or the MOSFET driver 204. Such a modification could entail lengthening the boss 248 and slightly plastically deforming the natural arc or bend in the wire bonds to the MOSFETs and the MOSFET driver through use of a simple axial press and an appropriate shaped tool. Minimize the gaps between these devices and the heat sink would reduce the conduction temperature drop along the secondary cooling path, and therefore further reduce the device temperature.

Although the MOSFET driver 204 produces very minimal heat in comparison to the MOSFETs 194, 196, it is important to maintain the driver temperature as low as possible. Each MOSFET has a targeted operating temperature in the 150° C. range. Because the MOSFET driver is packaged with the MOSFETs in the power module housing 222, without special provisions made for cooling the driver 204, it would also be subject to an environment in the 150° C. range since it is surrounded by surfaces generally at this higher temperature.

Ambient cooling air surrounding the electric machine 130 is typically in the 125° C. range. Bi-directional cooling for the MOSFET driver 204 in the power module enables cooling the MOSFET driver to temperatures lower than the MOSFET temperatures. By positioning the integrally-formed boss 248 extending from the interior surface 246 of the cast aluminum module cover plate 240 into close, spaced proximity to the MOSFET driver, heat from the space immediately about the driver, including heat loss from the driver itself, is transferred to the boss 248 surface and conducted along the secondary cooling path 244 to the exterior cover plate surface 238, from which it is convectively lost to the ambient air. The MOSFET driver can thus be cooled to a temperature lower than the bulk temperature around the driver 204 and close to the ambient air temperature, thereby improving the driver's reliability.

A secondary benefit of providing the cast aluminum cover plate 240 with the integral bosses 248 is that the bosses serve to increase thermal capacity. Bi-directional transient cooling is provided by the increased thermal capacity provided by the cast aluminum bosses. In use, a power module 154 is not only subject to continuous electrical operation but, by the nature of the product and its usage, also experiences peak use conditions. Under such conditions high transient electrical loading occurs, during which the devices 194, 196, 204 are typically at their greatest temperatures. The high transient electrical loading therefore translates into high transient thermal loading, which can undermine the reliability of the power electronics devices. The mass of the main heat sink 180 portion in the vicinity of the power module mounting locations 178 significantly helps absorb the transient thermal energy, but the mass of the cast aluminum cover plate bosses 248, whose surfaces are positioned in close proximity to the power electronics devices 194, 196, 204 and form parts of the secondary cooling path 244, also helps absorb the transient thermal energy and keep the devices relatively cooler during machine operation under peak use conditions. From a thermal capacitance perspective, a thermal capacitor is thus effectively provided radially inwardly and radially outwardly of the power electronics components of each MOSFET module, and serve to absorb the thermal transients.

The bi-directional cooling facilitated by the cast aluminum module cover plate 240 also helps achieve a common electronic package design embodiment to be used for both air-cooled and liquid-cooled applications. Such embodiments are necessarily sub-optimized thermally relative to each cooling medium individually to allow the physical layout and design of the electronic package 132 to remain common. However, removal of some of the waste heat from the power MOSFETs 194, 196 via the secondary cooling path 244 lessens the requirement for heat transfer therefrom via the primary cooling path 202. The removal of a portion of the generated heat through the module cover plate 240 via the secondary cooling path 244 helps minimize compromises that sub-optimize cooling performance relative to each medium individually, and facilitates providing a common electronic package 132 design that meets the thermal requirements of both cooling media.

Bi-directional cooling of the power electronics devices beneficially allows identical embodiments of an electronic package 132 according to the present disclosure, to be used in both air-cooled and liquid-cooled electric machines 130. Bi-directional cooling of each power module 154 is provided by the power module being mounted in thermally conductive contact to the main heat sink 180. The main heat sink in turn transfers heat received from the power electronics devices to an air or liquid cooling medium. Bi-directional cooling of each power module 154 is also provided by the finned, cast aluminum module cover plate 240, which transfers heat received through bosses 248 from the power electronics devices, convectively to ambient air.

In other words, MOSFET cooling along the primary cooling path 244 is initially by conduction through the power module mounting surface 178 of the main heat sink 180, and subsequently by convection from the main heat sink 180, or an electric machine rear frame member 134, 144 to which the cooling tower 158 is attached, to an air or liquid cooling medium. MOSFET cooling along the secondary cooling path 244 is initially by conduction through the module cover plate 240 heat sink, and subsequently by convection to ambient air from the fins 242 formed on the outside surface 238 of module cover plate 240.

As discussed above, placement of the electronic control circuitry 188 at a radially central location in the cooling tower air passage 174 in air-cooled electric machine embodiments 130, particularly in electric machine embodiments exhibiting an air flow dead zone, minimizes the negative impact on air flow due to blockage. Minimizing the axially projected area of the radially centrally positioned control electronics 188 in air-cooled electric machine embodiments can, however, provide improvements to the air flow through the cooling tower 158, particularly in machine embodiments 130 not characterized by an air flow dead space.

To this end, certain embodiments of an electronic package according to the present disclosure include electronic control circuitry 188 having circuit board material portions 250 turned on edge relative to their typical orientation in prior electric machines 100, so as to extend in directions substantially parallel with the cooling tower central axis 168. In other words, the control circuitry portions 252 of such embodiments are oriented substantially perpendicularly relative to a generally planar back face 144 of the rear frame. This orientation allows the electronic control circuitry 188 to be contained within a minimal axially projected area, near the radial center of the cooling tower 158.

In the depicted embodiment, electronic control circuit portions 252 so oriented are disposed within a plastic cup or receptacle 254 defined by a floor 256 and enclosing side walls 258 that extend along the radially inner surfaces 184 of the second cooling tower wall 182 that defines the well 186. In this embodiment, the axially forward surface 260 of the receptacle floor 256 is substantially flush with the second axial end 164 of the cooling tower 158, which is adapted for attachment to a rear frame member 134, 144 of an electric machine 130. The receptacle floor 256 of this embodiment is recessed to receive the rear axial end of the rotor shaft and a brush holder. The side walls 258 of the receptacle define an opening 262 over which a metallic lid or cover plate 264 containing the regulator terminal 266, is mounted to enclose the receptacle's interior space. The control circuitry 188, receptacle 254 and cover plate 264 define a control electronics assembly 268. The control electronics assembly is mounted within and protected by surrounding second wall 182 of the cooling tower 158. The receptacle 254 may be made of glass-filled nylon, and thermally isolates the control electronics 188 from heat generated by and lost by the MOSFETs, by greatly increasing the conductive thermal resistance therebetween. The lid 264, however, is metallic and exposed to the oncoming cooling air to provide heat sinking for control electronics components (such as the field output device) which do produce a small amount of heat, generally in the 5-10 watt range. Placing control circuit portions 252 including these types of control electronics components on the axially forwardly facing interior surface 270 of the receptacle lid 264 thermally isolates those components from the rest of the control electronics circuitry.

The construction of the control electronics assembly's cup 254 and lid 264 provides protection for the control electronics 188 by shielding them from external splash and contaminants. It also reduces overall cost by providing a protective housing for the electronics that does not require additional packaging or overmolding of the circuit board for protection. In addition, the surrounding wall 182 of the cooling tower well 186 provides means for mounting and protecting the control electronics assembly 268. As noted above, the well structure 186 can be of different shape or depth or be omitted altogether. Likewise, configuration of the control electronics assembly 268 may likewise be other than as shown.

While certain embodiments of the electronic package 132 include electronic control circuitry 188 utilizing only rigid circuit board material 250, certain other embodiments of the electronic package 132 include electronic control circuitry 188 utilizing flexible circuit board material 272. Such material is commercially available from, for example, Minco Products, Inc. of Minneapolis, Minn., USA (www.minco.com). This material can yield the same type of properties and design flexibility, including multiple layers, as conventional, rigid circuit board material. However, the flexible circuit board material 272 can be bent, twisted, folded or otherwise deformed, and still perform substantially like rigid circuit board material.

According to a first embodiment of this design, component hardboards including control circuit portions 252 to be carried by the flexible circuit board material 272 are laminated to the flexible circuit board material. The flexible circuit board material 272 is produced with electrically conductive traces or wires 274 through which conductors of control circuit portions 252 included on separate component hardboards 250 may be electrically interconnected. In corners between adjacent rigid component hardboards 250, the flexible circuit board material 272 (and its interconnecting conductive traces 274) is deformed to facilitate hardboard positioning in different planes, thus allowing the rigid component circuit boards 250 to be interconnected without the use of any pin type connectors and/or cabling.

Figure 52:
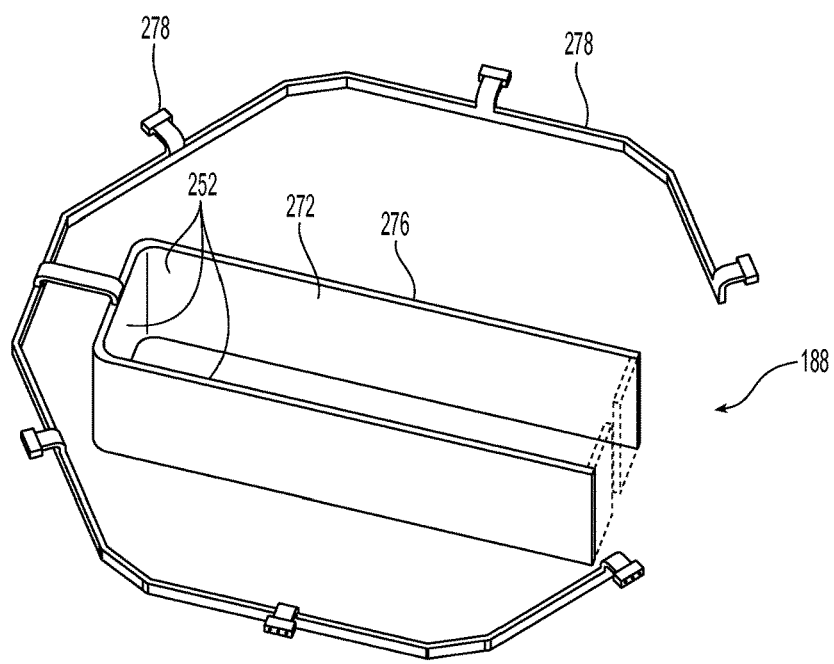
FIG. 52 is a rear perspective view of an alternative embodiment of the circuit board portions and signal leads shown in FIG. 51, wherein the signal leads and the circuit board material on which control circuit portions are disposed, are integral with each other, and defined by a plastically deformed singular flexible circuit board material piece, also showing optional, additional circuit board portions in dashed lines.
Figure 53:
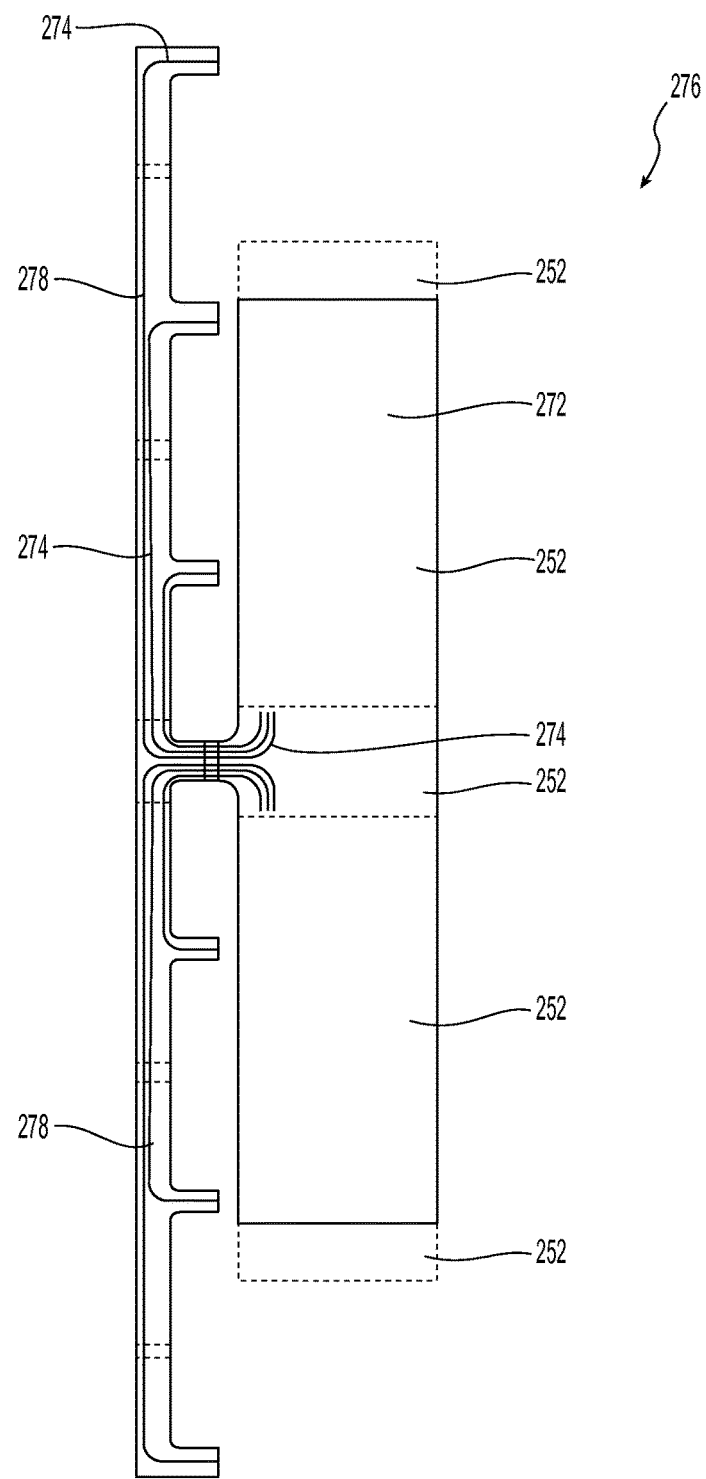
FIG. 53 is a plan view of the singular flexible circuit board material piece of FIG. 52 in its undeformed state, also showing the optional, additional circuit board portions in dashed lines.
Figure 54:
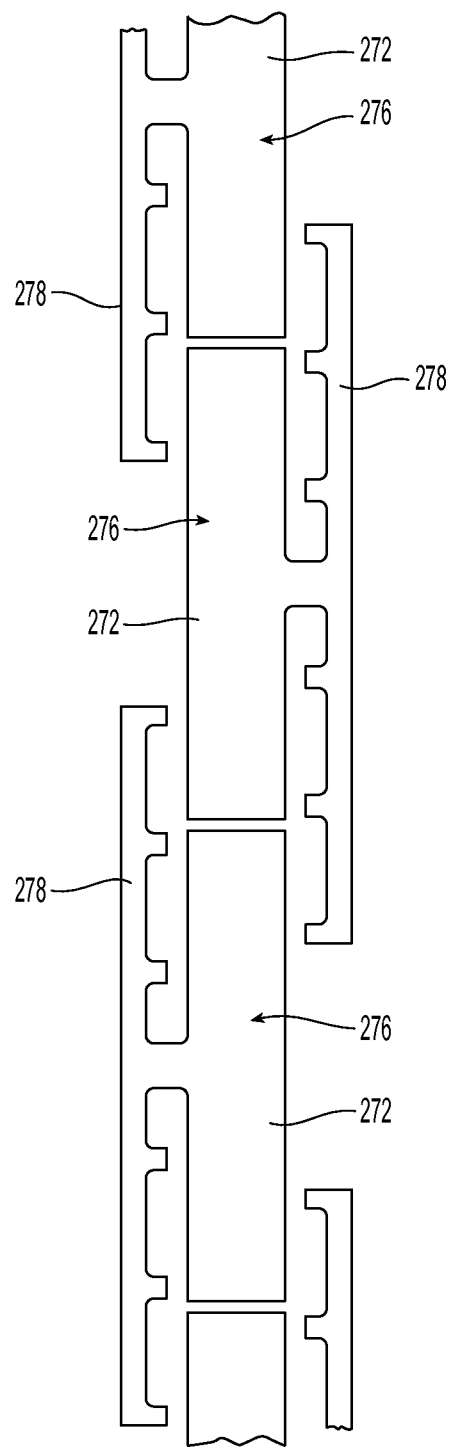
FIG. 54 is a plan view of a nested plurality of undeformed flexible circuit board and signal lead material pieces arranged in a plane for shipping or assembly.
Figure 55:
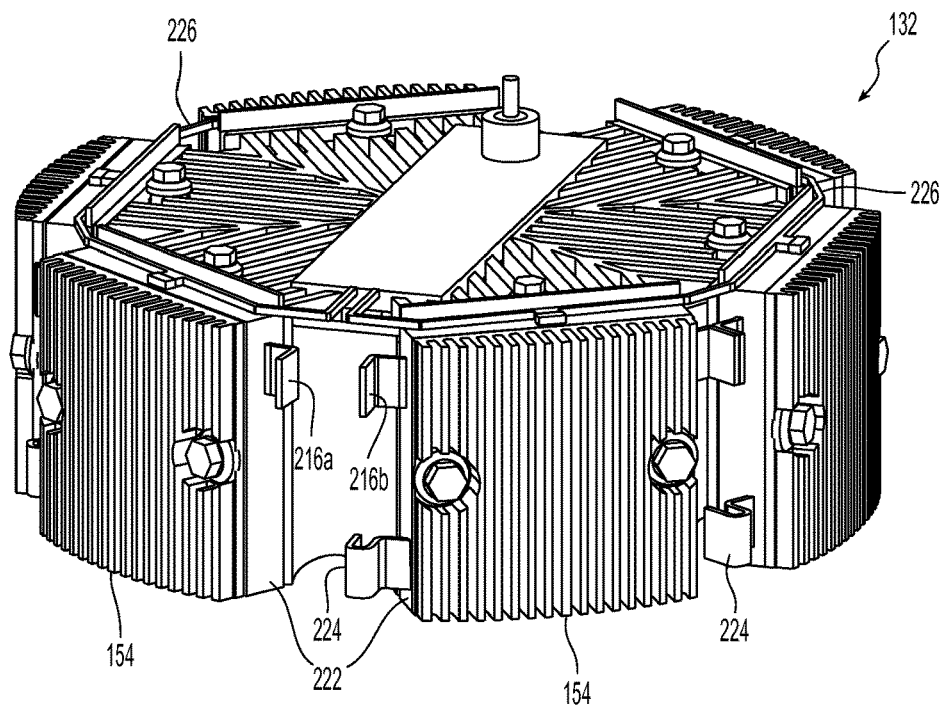
FIG. 55 is rear perspective view of the electronic package embodiment of FIG. 7 with its cover omitted.
Figure 56:
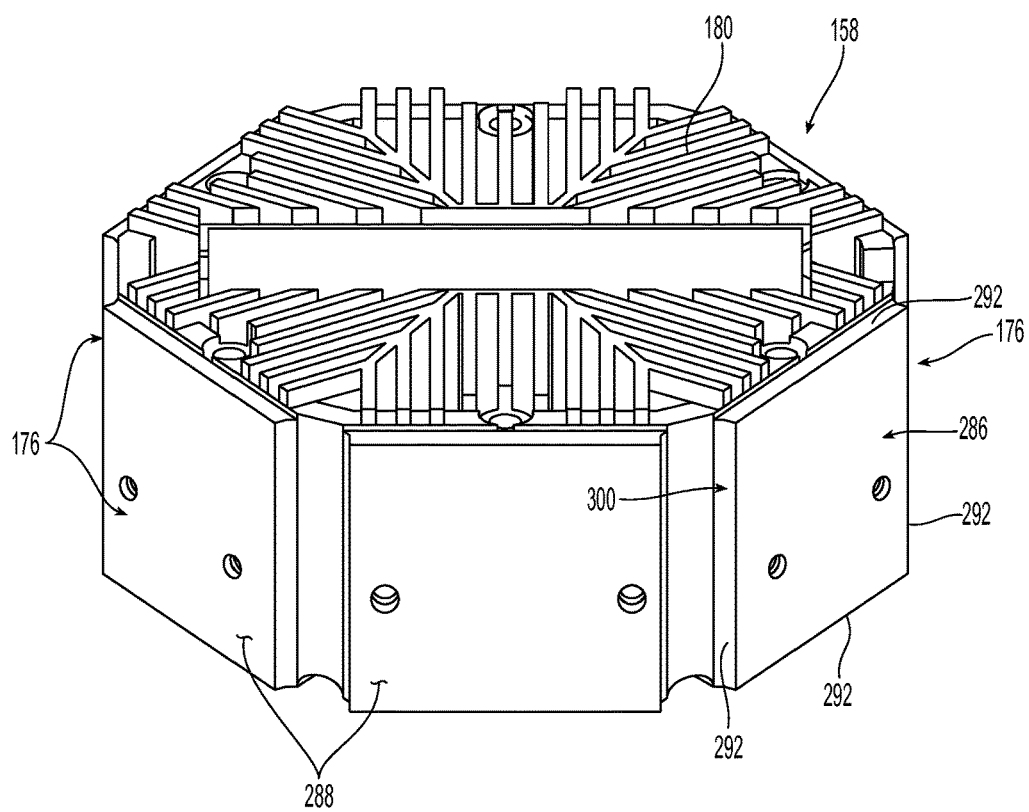
FIG. 56 is a rear perspective view of an alternative cooling tower embodiment provided with radially extending pedestals defining mounting surfaces for MOSFET modules.
Figure 57:
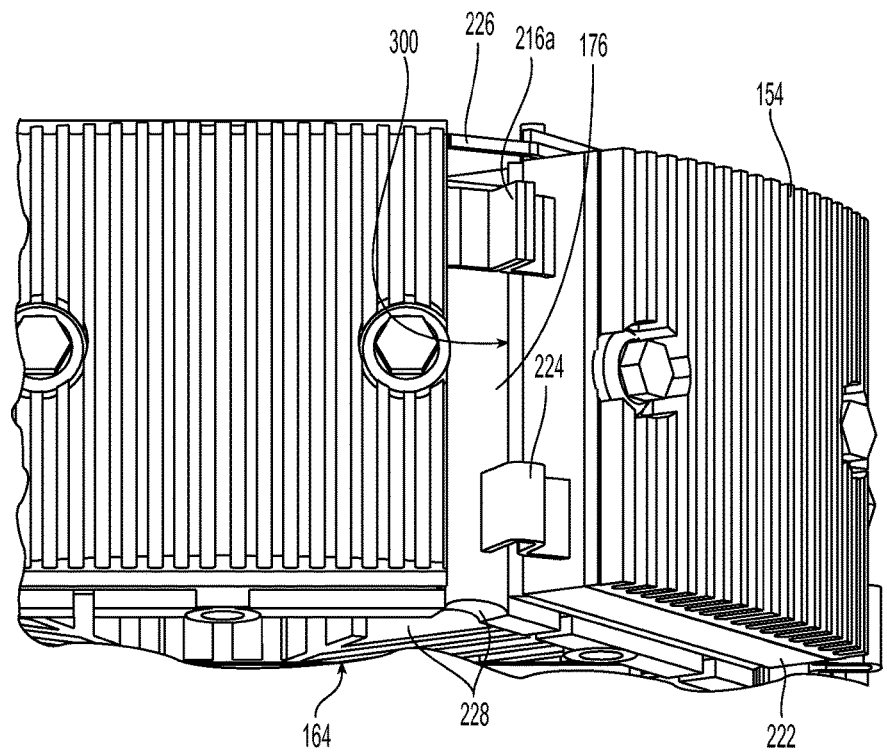
FIG. 57 is a fragmented front perspective view of an electronic package including the cooling tower embodiment of FIG. 56.
Figure 58:
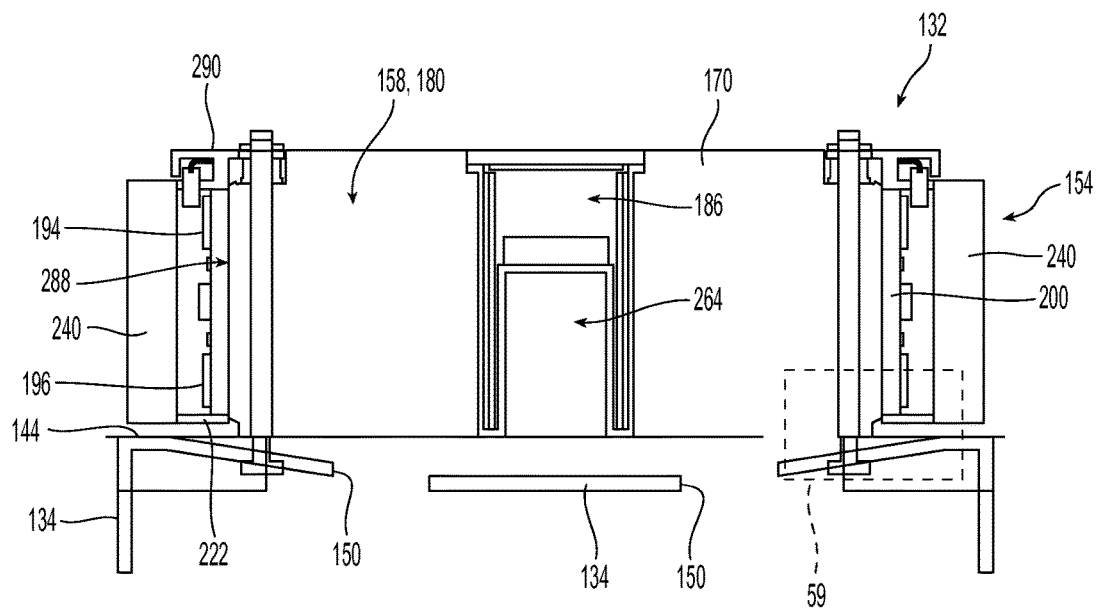
FIG. 58 is a sectional view along line 58-58 of FIG. 11, modified to include the cooling tower embodiment of FIG. 56, showing locations of gutters/ledges along cooling tower pedestal edges for splash drainage.
Figure 59:
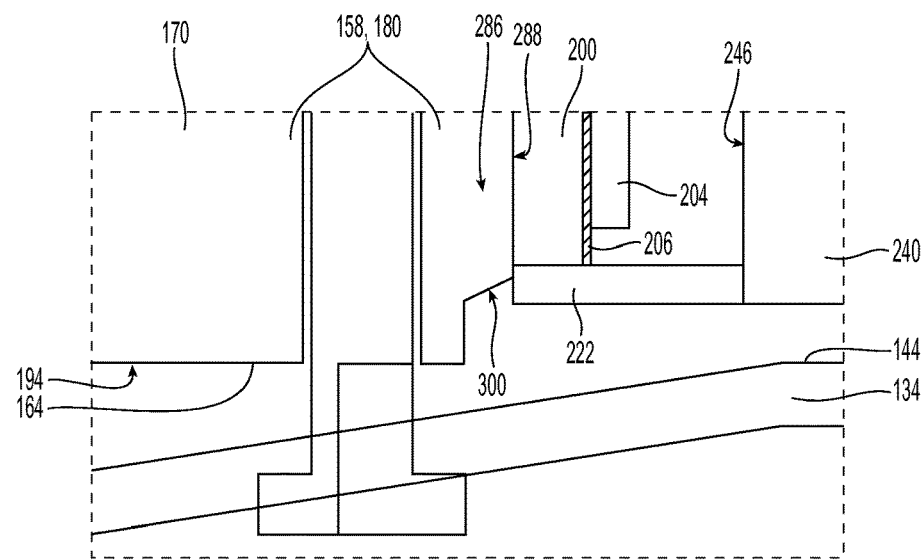
FIG. 59 is an enlarged view of rectangular outlined area 59 of FIG. 58, showing gutters/ledges along cooling tower pedestal edges for splash drainage.
Figure 60:
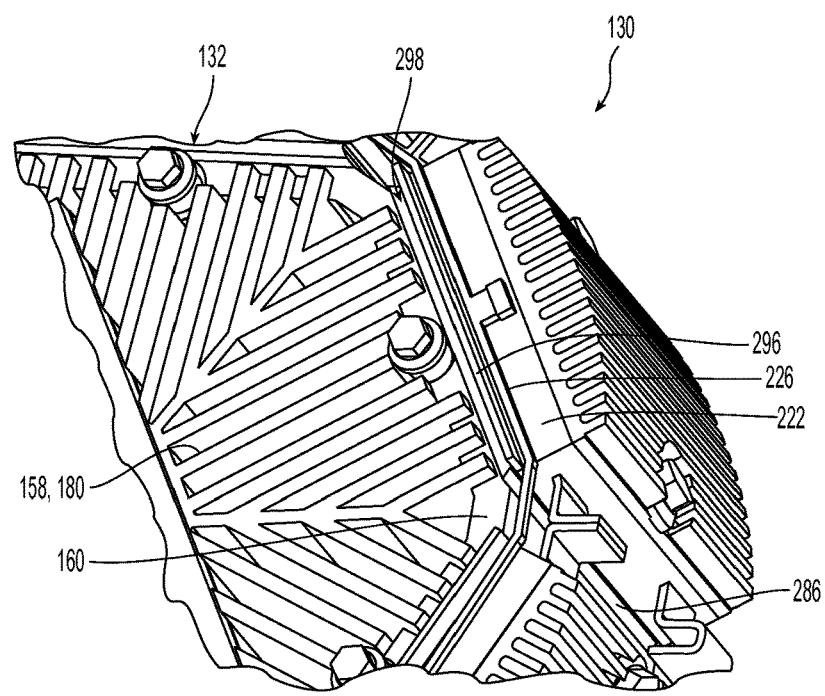
FIG. 60 is a fragmentary, rear perspective view of a portion of the electronic package including the cooling tower embodiment of FIG. 56, showing gutters/ledges along cooling tower pedestal edges for splash drainage.
Figure 61:
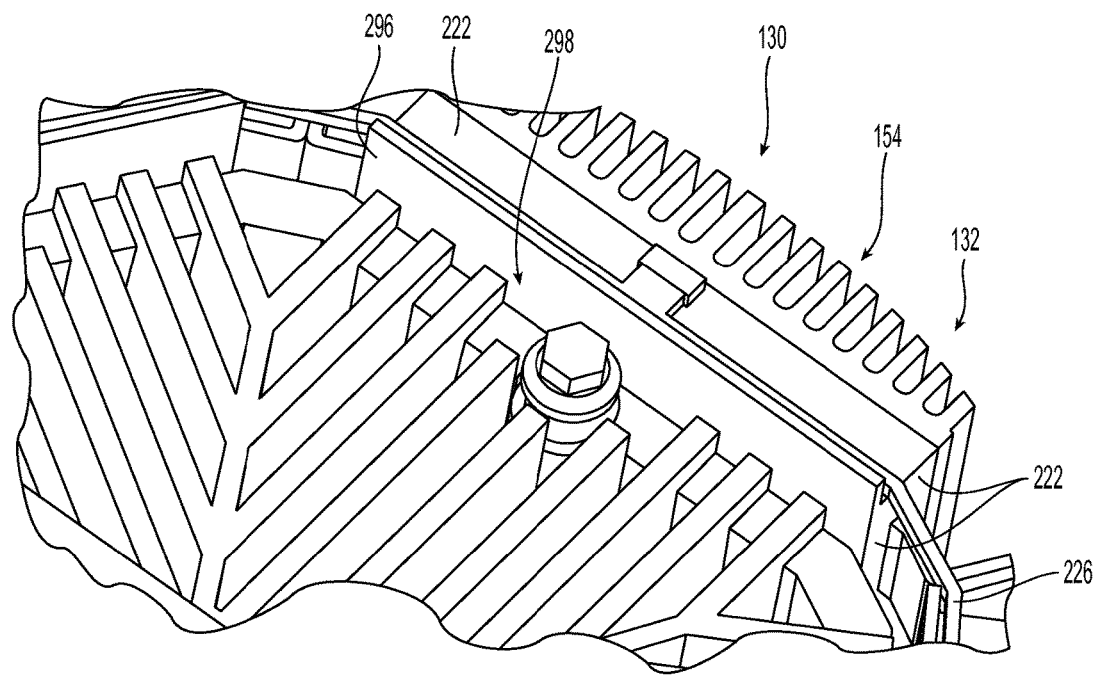
FIG. 61 is another fragmentary, rear perspective view of a portion of the electronic package of FIG. 60, showing gutters/ledges along cooling tower pedestal edges for splash drainage.
Figure 62:
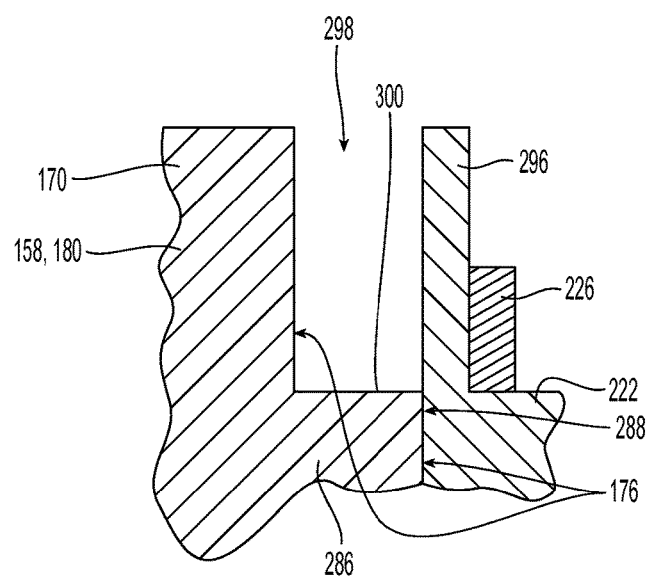
FIG. 62 is an enlarged, fragmented sectional view along line 62-62 of FIG. 11, modified to include the cooling tower embodiment of FIG. 56, showing the gutter/ledge along the rear edge of an example pedestal for splash drainage.
Figure 63:
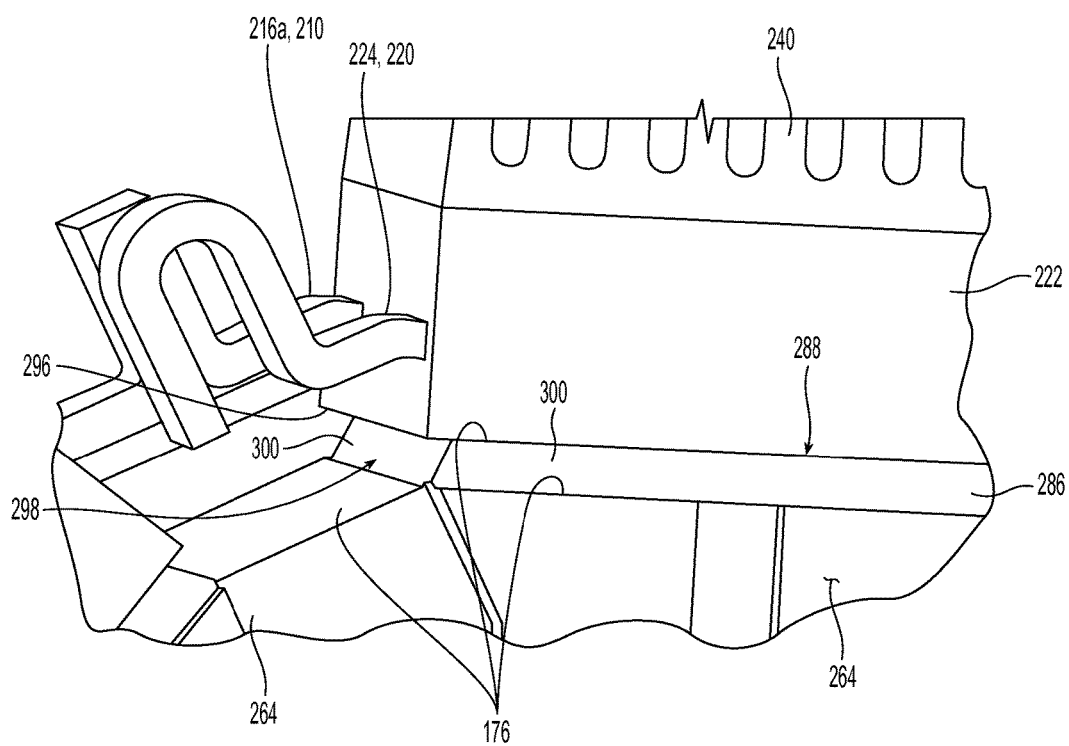
FIG. 63 is an enlarged, fragmented front perspective view between circumferentially adjacent MOSFET modules of an electronic package embodiment of the present disclosure including the cooling tower embodiment of FIG. 56, showing gutters/ledges for splash drainage.

In some alternative embodiments, the control circuitry layout is broken up into multiple control circuit portions 252, which are then printed/assembled on flexible circuit board material 272 to be provided as a singular piece 276 of flexible circuit board material 272 in the control circuitry 188. The electrically conductive traces 274 of multiple flexible circuit board layouts are printed on a sheet of flexible circuit board material substrate, the individual flexible circuit board material pieces 276 are then cut from the sheet. Similar versions of flexible circuit board material 272 may be produced that vary in length and conductor configuration to accommodate optional control circuit portions, as indicated by the dashed outlines in FIGS. 52 and 53. Referring to FIG. 54, the flexible control circuit material 272 nests nicely in an undeformed state, which facilitates high material utilization of storage and shipping containers.

Some embodiments take further advantage of the properties of flexible circuit board material 272 and the in these embodiments the control circuitry 188 includes integrally formed signal leads 278 between the control circuitry 188 and the MOSFET gate driver 204. The signal leads 278 include conductors 274 printed on the same, singular piece of flexible circuit board material 272 used for the control circuitry. In other words, the signal leads 278 of flexible circuit board material 272 extend to the various MOSFET gate drivers 204 and are simply bent into position along the wall of the molded plastic MOSFET module housing 222 material. Connector bodies 282 can be added directly to the flexible circuit board material 272 at the terminal ends of the signal leads 278 and their respective conductors 274. These connectors are then plugged into the MOSFET driver connector terminals 284 of respective MOSFET modules 154 to complete the circuit. Thus, a separate wiring harness containing signal leads for communicating the gate driver signals from the control circuit assembly 188 to the six MOSFET modules 154, and the separate, associated wiring connections between that wiring harness and the control circuitry, are eliminated.

A pedestal 286 of aluminum material is provided on the cooling tower first wall 160 where the MOSFET modules are mounted. Pedestal 286 can be machined by the side edges of an axially moveable cutting tool, thereby providing a simpler approach to forming a flat mounting surface and minimizing the thermal drop between the MOSFET modules 154 and the heat sink 180. The entire axial extent of the pedestal mounting surface can thus be cut at once by clamping the cooling tower 158 in an upright position at a milling station thereby allowing easy access to the pedestal mounting surfaces. In addition, at one fixed milling station, a tool path can be set up to machine all pedestal mounting surfaces at once.

Another benefit relating to this seemingly subtle, but rather important design feature concerns the thermal aspects of the design. The electronic package 132 disclosed herein will be used in electric machine 130 applications with very demanding transient loading on the power electronics, such as providing the starting torque for an engine.

With these short transient conditions, the high current and resulting temperature increase can be best endured by providing sufficient thermal mass located as close as possible to the MOSFET to absorb the transient spike in heat generated during this period of time. The pedestal 286 of additional aluminum mass is provided to the cooling tower at the mounting surface exactly where it is needed without adding mass throughout the entire peripheral surface of the cooling tower which would result in little benefit at additional cost. This also has a secondary benefit to increase the cross sectional area radially inward of the MOSFETs where is it most needed for conductive heat spreading. Again, increasing the cross-sectional area of the heat sink further away from the MOSFETs is comparatively less effective and would increase cost while providing limited benefit. Through use of a separate pedestal for each respective MOSFET module, the thermal conduction benefit is maximized while minimizing the additional material cost.

Another subtle but significant benefit of the disclosed pedestal structure is the electrical clearance it provides between ground and the B+ and phase lead conductors 216a, 216b, 230. By having each MOSFET module 154 mounted on a respective pedestal mounting surface 288 at an increased radial distance from the radial outer surface of the first wall 160, and then overhanging the plastic rear shroud 290 of the electronic package around the module 154 and over the edge of its pedestal, the electrical clearance between the conductors 216a, 216b, 230 and the grounded cooling tower heat sink 180 is increased directly by the radial height of the pedestal 286.

Yet another benefit provided by the novel pedestal structure relates to improved contamination and splash protection. Were the MOSFET modules 154 mounted with base 200 flush against the exposed, radially innermost, portion of the power module mounting surface of the radially outwardly oriented cooling tower heat sink surface, any encountered splash could run down the face of the heat sink, e.g., radial outer surface 176, and road contaminants in the splash could then directly span or bridge the radial distance from grounded portions of the module 154 or heat sink 186 to locations where the conductors 216a, 216b, 224 exit the module, or result in contaminants being deposited along the edge of the MOSFET module base heat sink-to-cover interface. This could undesirably lead to road contaminants entering into the MOSFET module(s) or result in current leakage from the module(s) or the conductors. By having each power module 154 mounted to the mounting surface of a radially outwardly projecting pedestal 286, with the module housing 222 having an overhung portion 296, a natural gutter 298 is formed that channels road splash away from this area. Electrical clearances between the module conductors 216a, 216b, 226 and the radially outer surface 176 is increased, which minimizes the possibility of these detrimental occurrences. A portion 296 of the plastic MOSFET module housing 222 extends beyond the perimeter of the pedestal 286 of the cooling tower heat sink 188 to create a ledge 300 which forms a natural gutter 298 that guides splash and provides drainage away from the area. The ledge 300 also lengthens the path between the module's copper terminals 216a, 216b, 224 and ground (i.e., the heat sink 180), and defines a geometry that is much harder for a conductive trace (e.g., from contaminates such as road salts) to build up. Such a conductive trace can often lead to current leakage problems.

The entirety of each pedestal 286 projects radially outwardly of the remainder of the tower structure 180, with its respective radially outwardly facing, planar MOSFET module mounting surface 288 being substantially parallel with the shaft axis. Thus, the tower is provided with a plurality of discrete, circumferentially distributed pedestals about the central axis. The pedestals 286 are evenly distributed (e.g., generally equiangularly) about radially outer surface of the cooling tower, and the module mounting surfaces are oriented tangentially relative to an imaginary circle concentric with, and oriented perpendicularly relative to the longitudinal direction of, the axis.

The pedestal surface 288 for MOSFET module attachment provides additional mass and cross sectional area for absorbing a thermal transient, thereby minimizing thermal conduction spreading resistance from the heat source, and does so in a manner that minimizes the amount of material added, and facilitates the ease and speed of machining the pedestal surfaces to which the MOSFET modules are mounted.

The pedestal mounting surface 288 for each MOSFET module provides increased separation, and electrical clearance, between the conductors exiting the modules and the exposed surfaces of the cooling tower heat sink 180, which is at ground potential.

The pedestals 286 provide splash and contaminant protection for the MOSFET modules by creating gutters 298 to guide splash and direct splash-borne contaminants away from the modules 154, and provide separation distances across which conductive traces of the contaminants are less likely to build up, which reduces the likelihood of current leakage from the modules.

While exemplary embodiments have been disclosed hereinabove, the invention is not necessarily limited to the disclosed embodiments. Instead, this application is intended to cover any variations, uses, or adaptations of the present disclosure using its general principles. Further, this application is intended to cover such departures from the present disclosure as come within known or customary practice in the art to which this present disclosure pertains and which fall within the limits of the appended claims.

What is claimed is:

1. An electronic package adapted for connection to a rear frame member of an electric machine, the electric machine including a stator having a plurality of stator windings and a rotor rotatable about a central axis, and wherein the electronic package comprises:
   a support structure having opposite first and second axial ends, the first axial end being adapted for engagement with the rear frame member with the support structure circumscribing the central axis, the support structure defining a radially inner wall surface and a radially outer wall surface;
   a plurality of power modules disposed on and circumferentially distributed about the radially outer wall surface whereby each of the power modules defines a mounting location, each of the power modules including a power electronics device, each of the power modules including a phase terminal coupled with the power electronics device and disposed radially outwardly of the radially outer wall surface;
   a plurality of ribs, wherein at least one of the plurality of ribs extends radially inwardly toward the central axis from the mounting location of each of the plurality of power modules;
   wherein the support structure defines a plurality of voids extending between the radially inner wall surface and the radially outer wall surface, each of the plurality of power modules being positioned proximate a separate one of the plurality of voids; and
   a plurality of phase leads, each of the plurality of phase leads extending through one of the plurality of voids and being connected to one of the phase terminals whereby each of the phase terminals is conductively couplable with a respective one of the stator windings of the electrical machine.

2. The electronic package of claim 1 wherein the plurality of voids are disposed at the first axial end of the support structure and define a plurality of open ended slots on the first axial end of the support structure.

3. The electronic package of claim 1 wherein the radially outer wall surface defines a plurality of circumferentially spaced planar mounting surfaces, each planar mounting surface engaging a respective one of the plurality of power modules.

4. The electronic package of claim 3 wherein the radially outer wall surface defines a plurality of discrete, radially outward projecting pedestals at circumferentially spaced locations, each of the projecting pedestals defining a respective one of the plurality of planar mounting surfaces.

5. The electronic package of claim 4 wherein the plurality of voids are disposed at the first axial end of the support structure and define a plurality of open ended slots on the first axial end of the support structure.

6. The electronic package of claim 4 wherein the power modules are substantially evenly distributed about the radially outer wall surface.

7. The electronic package of claim 1 wherein the support structure is formed out of a metal material and defines a heat sink in thermal communication with the plurality of power modules, the radially inner surface defining an air passage axially extending between the first and second axial ends of the support structure.

8. The electronic package of claim 7 wherein the plurality of ribs are in conductive thermal communication with the radially inner wall surface, the ribs being disposed within the air passage.

9. The electronic package of claim 8 wherein the plurality of voids are disposed at the first axial end of the support structure and define a plurality of open ended slots on the first axial end of the support structure.

10. The electric machine of claim 8 wherein the radially inner wall surface and the radially outer wall surface are defined by a first wall which circumscribes the central axis and wherein the support structure further comprises a second wall circumscribing the central axis and disposed radially within the first wall; and
wherein the air passage is disposed between the first and second walls and wherein the plurality of ribs extend between and interconnect the first wall and the second wall.

11. The electric machine of claim 10 wherein the plurality of ribs comprises a plurality of parallel spaced apart ribs extending radially inwardly from the mounting location defined by each of the plurality of power modules and wherein each of the plurality of ribs define a plane parallel to the central axis.

12. The electric machine of claim 11 wherein the radially outer wall surface defines a plurality of circumferentially spaced planar mounting surfaces, each planar mounting surface engaging a respective one of the plurality of power modules and being disposed in a plane parallel to the central axis.

13. An electric machine comprising a stator, a rotor surrounded by and rotatable relative to the stator about a central axis, a rear frame member rotatably fixed relative to the stator and through which the central axis extends, and an electronic package according to claim 1, wherein:
the central axis extends through the support structure of the electronic package with the support structure being connected to the rear frame member.

14. The electric machine of claim 13 wherein the plurality of voids are disposed at the first axial end of the support structure and define a plurality of open ended slots on the first axial end of the support structure.

15. The electric machine of claim 13, wherein the electric machine is air-cooled and the rear frame member has an aperture through which cooling air flow is drawn generally axially, in the direction of the rotor relative to the electronic package, for cooling the electric machine at locations downstream of the aperture.

16. The electric machine of claim 15 wherein the support structure is formed out of a metal material and defines a heat sink in thermal communication with the plurality of power modules, the radially inner surface defining an air passage axially extending between the first and second axial ends of the support structure, the air passage at the first axial end of the support structure being in communication with the aperture in the rear frame member.

17. The electric machine of claim 16 wherein the plurality of ribs are in conductive thermal communication with the radially inner wall surface, the ribs being disposed within the air passage.

18. The electric machine of claim 17 further comprising a fan rotatable with the rotor about the central axis, wherein the air flow through the air passage and the aperture is induced by fan rotation.

19. The electric machine of claim 18 wherein the plurality of voids are disposed at the first axial end of the support structure and define a plurality of open ended slots on the first axial end of the support structure.

20. The electric machine of claim 13 wherein the electric machine is liquid-cooled and the rear frame member defines a metallic wall extending substantially perpendicularly relative to the central axis, the rear frame member wall having an inner axial side in contact with liquid coolant and an opposite outer axial side in conductive thermal communication with the support structure.

\* \* \* \* \*